(12) United States Patent
Fjelstad

(10) Patent No.: US 6,821,821 B2
(45) Date of Patent: Nov. 23, 2004

(54) METHODS FOR MANUFACTURING RESISTORS USING A SACRIFICIAL LAYER

(75) Inventor: Joseph Fjelstad, Maple Valley, WA (US)

(73) Assignee: Tessera, Inc., San Jose, CA (US)

( * ) Notice: Subject to any disclaimer, the term of this patent is extended or adjusted under 35 U.S.C. 154(b) by 60 days.

(21) Appl. No.: 09/732,821

(22) Filed: Dec. 8, 2000

(65) Prior Publication Data

US 2002/0009860 A1 Jan. 24, 2002

Related U.S. Application Data

(63) Continuation-in-part of application No. 09/409,205, filed on Sep. 30, 1999, now Pat. No. 6,294,830, which is a division of application No. 09/085,352, filed on May 27, 1998, now Pat. No. 6,093,584, which is a continuation of application No. 08/634,464, filed on Apr. 18, 1996, now Pat. No. 6,001,671.

(51) Int. Cl.[7] ........................... H01L 21/48; H01C 17/00
(52) U.S. Cl. ..................... 438/124; 438/126; 438/127; 438/464; 29/610.1; 29/620; 29/621
(58) Field of Search ................. 438/110, 113, 438/114, 124, 126, 127, 458, 460, 464, 106.612; 29/610.1, 592.1, 592, 620, 621; 257/684–687, 723, 724, 730, 784, 787

(56) References Cited

U.S. PATENT DOCUMENTS

| | | |
|---|---|---|
| 1,948,774 A | 2/1934 | Siegel |
| 3,601,745 A | 8/1971 | Helgeland |
| 3,717,837 A | 2/1973 | Maclachlan |
| 4,530,152 A | 7/1985 | Roche et al. .................. 29/588 |
| 5,122,860 A | 6/1992 | Kikuchi et al. ............. 257/679 |
| 5,157,480 A | 10/1992 | McShane et al. ........... 257/693 |
| 5,200,362 A | 4/1993 | Lin et al. .................... 438/126 |
| 5,273,938 A | 12/1993 | Lin et al. .................... 438/107 |
| 5,436,203 A | 7/1995 | Lin .............................. 438/126 |
| 5,468,999 A | 11/1995 | Lin et al. ..................... 257/784 |
| 5,487,999 A | 1/1996 | Farnworth .................... 438/17 |
| 5,557,150 A | 9/1996 | Variot et al. ................ 257/787 |
| 5,608,265 A | 3/1997 | Kitano et al. ............... 257/738 |
| 5,835,988 A | 11/1998 | Ishii ........................... 257/684 |
| 5,844,315 A | 12/1998 | Melton et al. .............. 257/738 |
| 5,864,281 A | 1/1999 | Zhang et al. |
| 5,894,108 A | 4/1999 | Mostafazadeh et al. ..... 174/52.4 |
| 5,937,512 A | * 8/1999 | Lake et al. .................... 29/832 |
| 6,001,671 A | * 12/1999 | Fjelstad ....................... 438/112 |
| 6,072,239 A | 6/2000 | Yoneda et al. .............. 257/730 |
| 6,093,584 A | * 7/2000 | Fjelstad ....................... 438/127 |
| 6,294,830 B1 | * 9/2001 | Fjelstad ....................... 257/724 |

FOREIGN PATENT DOCUMENTS

| | | | |
|---|---|---|---|
| JP | 59-208756 | * | 11/1984 |
| JP | 63-177430 | | 7/1988 |
| JP | 63-283136 | | 11/1988 |
| JP | 1-231133 | | 9/1989 |
| JP | 1-231134 | | 9/1989 |
| JP | 1-297848 | | 11/1989 |
| JP | 2-12931 | | 1/1990 |
| JP | 2-77137 | | 3/1990 |
| JP | 3-94459 | * | 4/1991 |
| JP | 3-944959 | | 4/1991 |
| JP | 3-178152 | | 8/1991 |
| JP | 3-239349 | | 10/1991 |
| JP | 5-198607 | | 8/1993 |
| JP | 10-84010 | * | 3/1998 |

* cited by examiner

*Primary Examiner*—Alonzo Chambliss
(74) *Attorney, Agent, or Firm*—Lerner, David, Littenberg, Krumholz & Mentlik, LLP

(57) ABSTRACT

An electrical resistor is made by providing a sacrificial layer and conductive pads disposed on a first surface of the sacrificial layer. An electrically resistive material is deposited over the pads and on the first surface of the sacrificial layer to form at least one unit including the resistive material and the pads. At least part of the sacrificial layer is then removed so as to expose one or more of the pads.

37 Claims, 17 Drawing Sheets

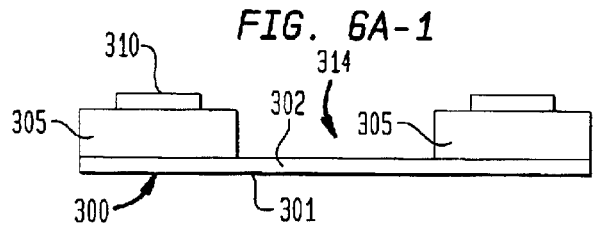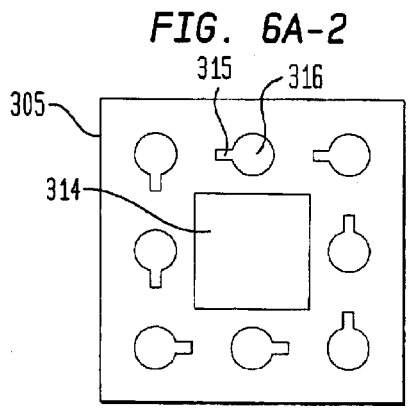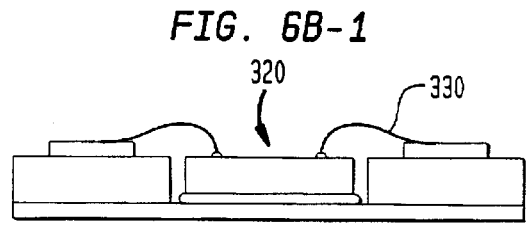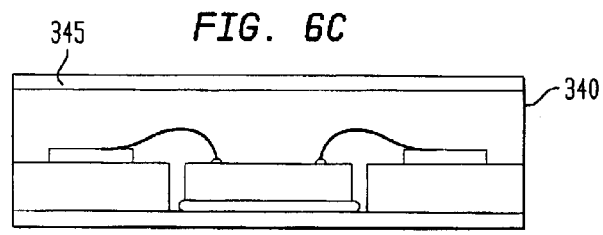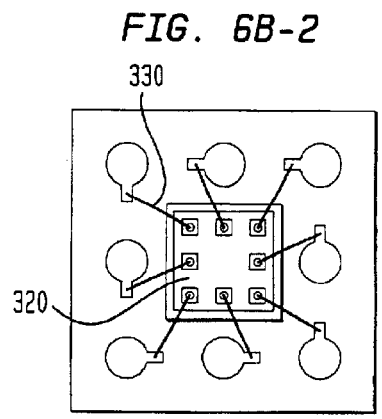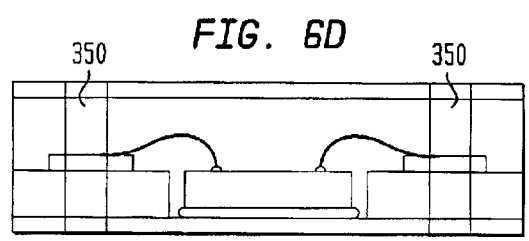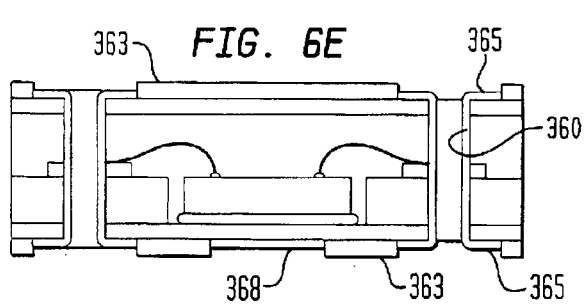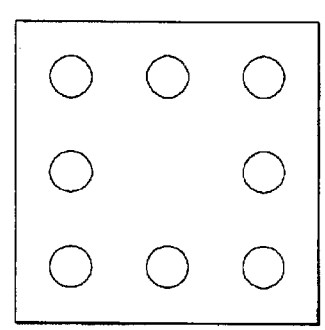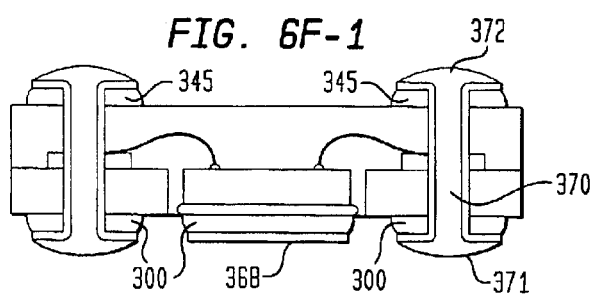

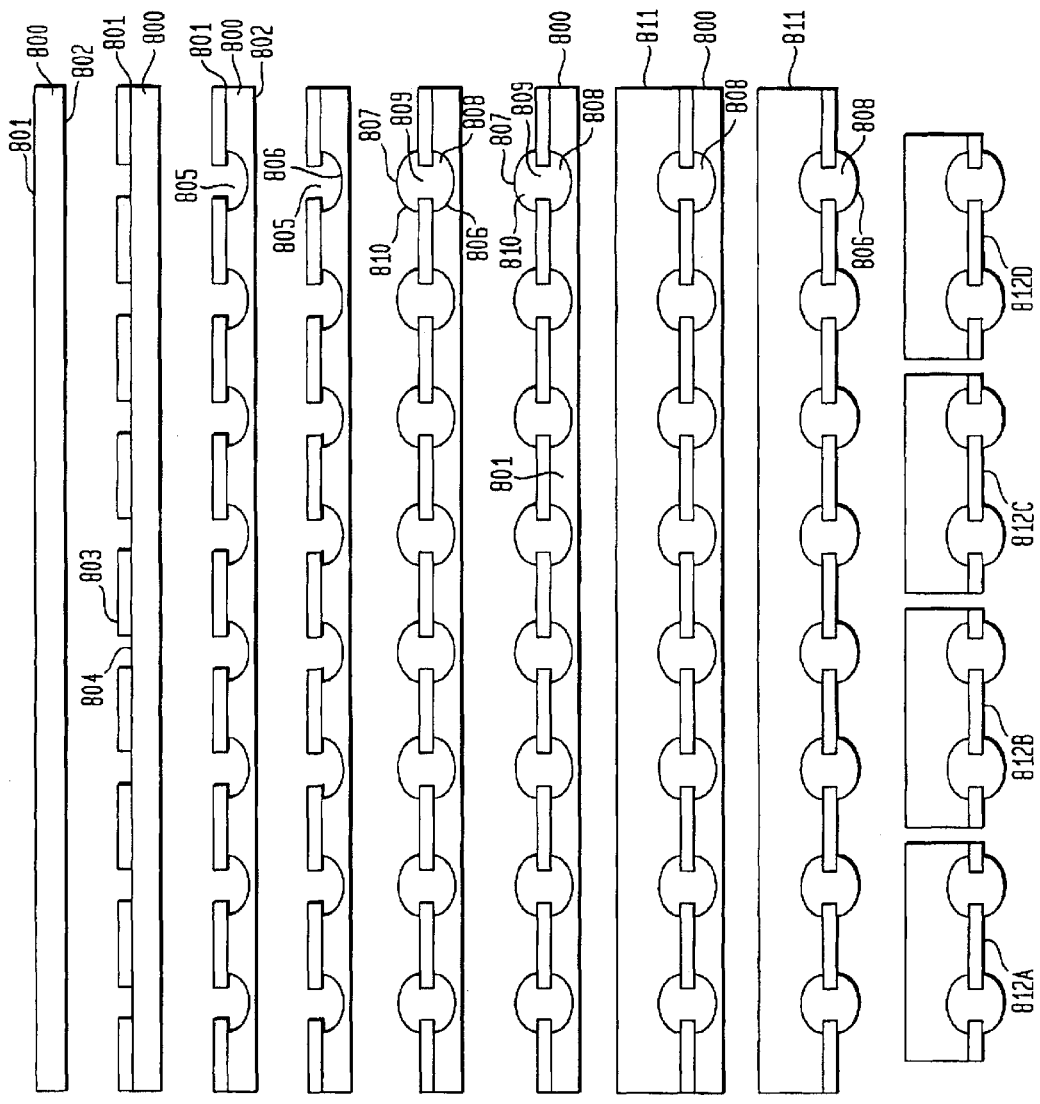

METHODS FOR MANUFACTURING RESISTORS USING A SACRIFICIAL LAYER

CROSS-REFERENCE TO RELATED APPLICATIONS

The present invention is a continuation-in-part of pending U.S. patent application Ser. No. 09/409,205 filed Sep. 30, 1999, now U.S. Pat. No. 6,294,830, which is a divisional of pending U.S. patent application Ser. No. 09/085,352 filed May 27, 1998, now U.S. Pat. No. 6.093,584 which is a continuation of U.S. patent application Ser. No. 08/634,464 filed Apr. 18, 1996, now U.S. Pat. No. 6,001,671, issued Dec. 14, 1999. The disclosures of said applications are hereby incorporated by reference herein.

FIELD OF THE INVENTION

The present invention generally relates to a resistor network having multiple different or common values in a single device manufactured using a single sacrificial layer.

BACKGROUND OF THE INVENTION

Resistors are presently fabricated using a number of different methods, depending on the requirements of the circuit in which resistors are to be used. Resistor types such as thin film resistors, thick film resistors, wound wire resistors, molded axial leaded resistors, surface mount resistors and others are known in the art.

Thin film resistors are fabricated by first depositing a resistive material, then a conductor material, onto a substrate. A wide variety of substrate materials can be used, but these materials generally contain an oxygen compound to permit adhesion of the resistive film. Materials used for thin film resistors generally must also be capable of providing adhesion to a substrate. The resistor film forms as single points on the substrate in the vicinity of substrate faults or other irregularities that might have an excess of broken oxygen bonds. The points expand into islands that form continuous films.

This differs from typical thick film resistor fabrication for which the conductor is deposited first onto a substrate, followed by the resistive material. In general, thick film resistors are formed by adding metal oxide particles to glass particles and firing the mixture at a certain temperature and for a predetermined time period sufficient to melt the glass and sinter the oxide particles together. The resulting structure consists of a series of three-dimensional chains of metal oxide particles embedded in a glass matrix. The higher the metal oxide-to-glass ratio, the lower the resistivity.

The drawback of traditional thick and thin film resistor manufacturing is that both processes tend to have many process steps. Another drawback to these methods of manufacture is that they are generally not capable of providing resistor networks having multiple different or common values in a single device. Further, current methods of manufacturing resistors generally result in the leads being located at the periphery of the resistor device. Peripherally located leads often suffer from the problem that these leads can be easily bent, requiring, in certain circumstances, that the resistor be glued in place. The proposed methods are more versatile than existing methods in that a wide range of resistor devices can be built using a single sacrificial layer, and that the resistor devices can be designed without peripherally located leads.

SUMMARY OF THE INVENTION

One aspect of the present invention provides methods of making resistors. A method of making resistors in accordance with this aspect of the invention desirably includes the steps of providing a sacrificial layer having a first surface and one or more pads including at least one electrically conductive material disposed over at least one region of said first surface, and depositing a resistive material over the pads and over said first surface of said sacrificial layer to thereby form at least one unit including the resistive material and the pad or pads. Following deposition of the resistive material, at least a portion of the sacrificial layer is removed so as to expose the one or more pads. Most preferably, a plurality of resistors is manufactured simultaneously using a single sacrificial layer. The method further may include separating at least some of said resistors from one another, typically after removing the sacrificial layer. For example, the resistive layer may form a large unit including numerous pads and a unitary resistive layer, and such unit can be subdivided to form individual resistors or resistor networks, each including a portion of the layer and at least one pad, and typically at least two pads.

The step of providing the sacrificial layer and the pads preferably includes depositing the conductive material onto said first surface of said sacrificial layer. In certain preferred embodiments, cavities are provided in the first surface of the sacrificial layer and the step of depositing the conductive material includes depositing at least one conductive material into these cavities. The step of providing said cavities in the first surface of the sacrificial layer desirably includes providing an apertured layer on the first surface and etching said first surface through the apertures in said apertured layer. For example, the apertured layer may be provided by providing a layer of a patternable material such as a photoresist and exposing the patternable material to light or other radiation in a pattern, and then developing the photoresist to form the apertures.

The conductive material of the pads may be deposited through the apertures, so as to form each pad with a bottom flange beneath the apertured layer, within a cavity, a post extending through an aperture, and a top flange overlying the top surface of the apertured layer. The apertured layer may be partially or completely removed, so as to leave the top flanges of the pads elevated above the surface of the sacrificial layer or above the surface of the remaining part of the apertured layer. The resistive material can be applied in a flowable state, as, for example, by molding, calendaring or coating, so that the resistive material encapsulates the top flanges and posts, thus firmly uniting the pads with the resistive material.

In a method according to a further aspect of the invention, the pads may be formed as hollow shells within the cavities of the sacrificial layer. The resistive material may penetrate into the interior spaces within these hollow shells.

A method of making resistors according to a further aspect of the invention desirably includes the steps of providing a sacrificial layer having a first surface and a second surface; depositing resistive material over the first surface of said sacrificial layer so that the resistive material adheres to the sacrificial layer; and selectively removing portions of the sacrificial layer to form one or more pads connected to said resistive material. For example, spots of an etch-resistant material can be applied to the second surface of the sacrificial layer, and the second surface can be exposed to an etchant so that portions of the sacrificial layer are left in place as individual pads where the etch-resistant material was applied.

Methods according to the foregoing aspects of the invention provide efficient manufacturing processes for forming resistors and for forming resistor networks incorporating plural resistances. The resistors and resistor networks can be compact, and can be particularly well-suited to circuit manufacturing techniques such as surface mounting on a printed circuit board or other circuit panel.

Still further aspects of the invention provide resistors and resistor networks.

Because understanding of the present invention can be facilitated by understanding of the disclosure in the aforementioned U.S. Pat. No. 6,001,671 (hereinafter the "'671 disclosure"), certain portions of the '671 disclosure are reproduced hereinbelow.

BRIEF DESCRIPTION OF THE DRAWINGS

FIG. 1E-2 shows a top view of FIG. 1D-1 in which several chips are back-bonded to a sacrificial layer and electrically connected thereto prior to the encapsulation step, according to the '671 disclosure.

FIG. 1D-2 is a top plan view of a chip and sacrificial layer according to another embodiment.

FIG. 1G-2 shows a bottom view of a multichip embodiment of FIG. 1G-1 after the sacrificial layer has been removed, according to the '671 disclosure.

FIGS. 6A-1 through 6F-1 show a side view of an alternate method of manufacturing a semiconductor package having vias extending from one side of the package to the other, according to the '671 disclosure.

FIG. 6A-2 shows a top view of FIG. 6A-1, according to the '671 disclosure.

FIG. 6B-2 shows a top view of FIG. 6B-1.

FIG. 6F-2 shows a bottom view of FIG. 6F-1.

FIGS. 7F-1 and 7G-1 show a first method of finishing the chip package shown in FIG. 7E.

FIGS. 7F-2 and 7G-2 show a second method of finishing the chip package shown in FIG. 7E.

FIGS. 8A through 8I are diagrammatic sectional views depicting successive stages in a method of making resistors, according to one embodiment of the present invention.

DETAILED DESCRIPTION OF THE PREFERRED EMBODIMENTS

Figure 1A:
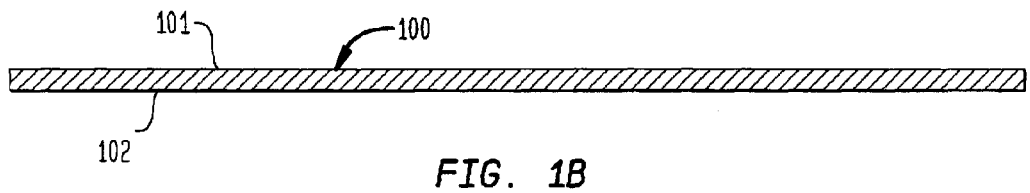
FIGS. 1A through 1G-1 show a side view of a method of manufacturing a semiconductor chip package, according to the '671 disclosure.

FIGS. 1A–G show a process for manufacturing inexpensive semiconductor chip packages, according to the one aspect of the '671 disclosure. FIG. 1A shows a side view of a sacrificial layer 100 having a first surface 101 and a second surface 102. The sacrificial layer 100 may be comprised of a conductive metallic material, a polymer material or a combination of both a conductive metallic material and a polymer material. Examples of possible sacrificial layer materials include aluminum, copper, steel, iron, bronze, brass, polyimide, polyetherimide, fluropolymer and alloys and combinations thereof. In FIG. 1A, the sacrificial layer is comprised of a sheet of aluminum having an approximate substantially uniform thickness of about 100–200 microns; although, the sacrificial sheet could be thicker or thinner in some embodiments.

Figure 1B:
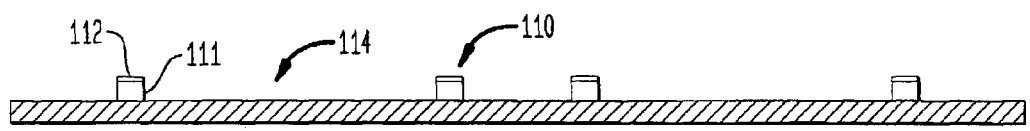

In FIG. 1B, a plurality of pads 110 are selectively formed, typically by an electroplating operation, so that the pads 110 are disposed on and attached to the first surface 101 of the sacrificial layer 100. The pads 110 are arranged on the first surface 101 of the sacrificial layer 100 so as to define a central region 114 between the pads of a particular package group. The pads may be arranged in single rows around the central region 114 or may be arranged in multiple rows in a substantially grid array arrangement, an example of which is shown in FIG. 1D-2. The pads 100 in this embodiment are comprised of a first layer of copper 111 and a second layer of gold 112. Typically, there is also a center barrier layer (not shown) of nickel to ensure that the copper and gold layers do not diffuse into one another. The gold layer 112 facilitates a bond that is made by the electrical connection to the chip contacts, as described in more detail below. The height of the pads 110 is not critical so long as a good electrical connection can be made thereto. In some embodiments, the pads may resemble posts. Other examples of permissible pad materials include copper, nickel, gold, rhodium, platinum, silver and alloys and combinations thereof. Typically, in a low pin count package, the pads 110 are all of the same height from the sacrificial layer 100. However, for higher pin count packages or for other reasons, the pads 110 may not all be of the same height from the sacrificial layer 100. Taller pads 110 can be used in outside rows of pads to ensure that the electrical connections between the contacts and the inner pads do not electrically short with the connections between the contacts and the outer pads. This can be useful in cases where the chip contacts are finely spaced or where the contacts are arranged in an area array on the face surface 121 of the chip 100, an example of which is shown in FIG. 1D-2.

Figure 1C:
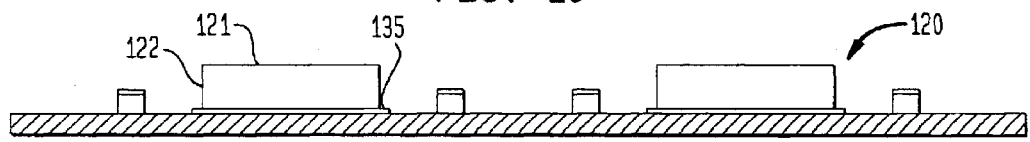
Figures 1, 1D:
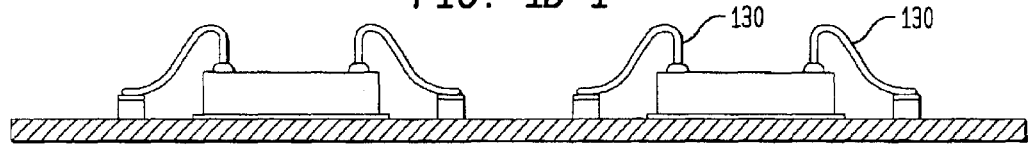

As shown in FIG. 1C, a back surface 122 of a semiconductor chip 120 (or several chips) is next coupled to the sacrificial layer 100 so that the contact bearing face surface 121 of the chip 120 faces away from the sacrificial layer 100. This arrangement is commonly referred to as "back-bonding" a semiconductor chip. Any suitable coupling agent 135 can be used for such back-bonding. Preferably, a thermally conductive die attach adhesive is used so that when a heat sink is attached, as described below, there is a more direct thermal path to draw heat away from the chip during thermal cycling. Examples of such preferable adhesive materials include silver filled epoxy, tin-lead solder, boron-nitride, aluminum filled silicone, alumina and copper filled epoxy, among others.

Figure 1E:
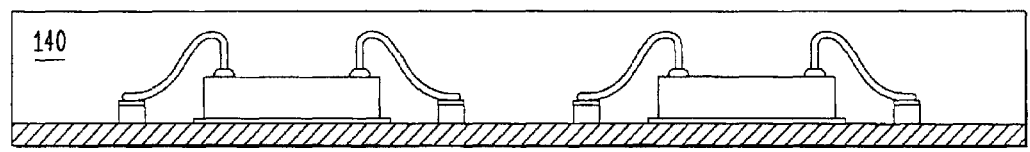

Next, the chip contacts (not shown) on the face surface 121 of the chip 120 are each electrically connected to a respective pad 110 by wirebonding the one to the other, as shown in FIG. 1D-1. The wirebonded connection 130 could take the form of a ball bond/stitch (or wedge) bond combination, as shown, or the wire could be stitch-bonded to both the chip contacts and the pads 110. Other conventions could be used to interconnect the chip contacts and the pads, such as TAB leads, electroformed beam leads, etc. FIG. 1E-2 shows a top view of FIG. 1D-1.

The assembly, including the first surface 101 of the sacrificial layer 100, the pads 110, the chip 120 and the electrical connections, is next encapsulated or over-molded by a flowable, curable dielectric material 140, as by convention semiconductor molding technology, as shown in FIG. 1E. The dielectric material is typically comprised of filled or unfilled standard thermoset or thermo plastic resins as used in the industry, such as epoxy resin, silicone resin or other plastic encapsulating material. The dielectric material is then fully cured.

Figure 1F:
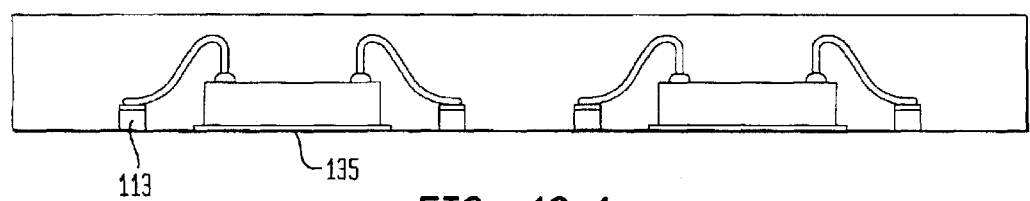

The sacrificial layer 100 is next removed, as shown in FIG. 1F. Here, the sacrificial layer is removed, using an etching operation, so as to expose the bottom surface 113 of the pads 110. The step of removing the sacrificial layer 100 also exposes the thermally conductive die attach adhesive 135. If desired, the sacrificial layer may be more selectively removed to provide added features on the bottom of the finished package, such as taller pads 110 which protrude from the bottom of the package, and/or a heat sink disposed beneath and protruding from the bottom of the bottom of the finished package and attached to the back surface 122 of the chip.

Figures 1, 1G:
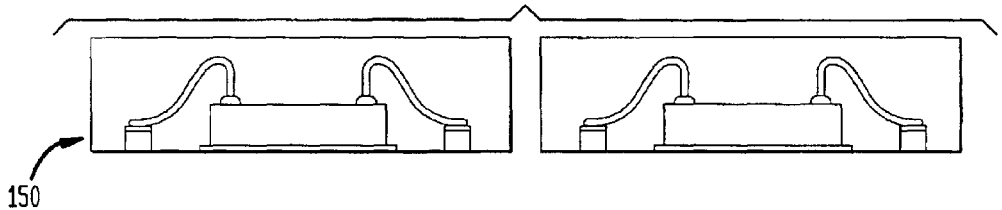
Figures 1, 1D, 2:
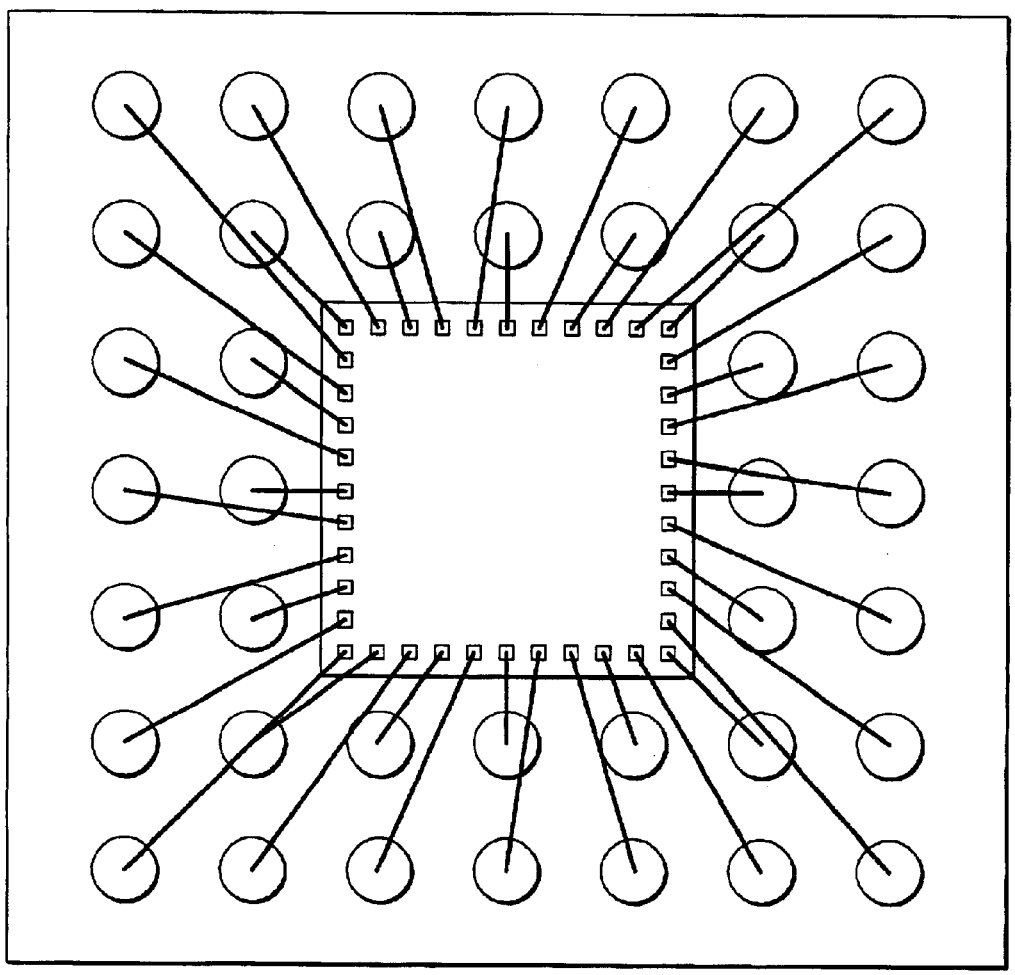

In FIG. 1G-1, the individual packaged chips 150 are "diced" or separated from each other. At this point, the exposed bottom surfaces 113 of the pads 110 may be attached to respective bond pads on the PWB. One method of making such an attachment is to connect solder balls to the bottom surface 113 of the pads 110. The solder balls are typically comprised of a combination of tin and lead and may further coat a solid metal ball such that the solder balls are non-collapsing. FIG. 1G-2 shows a bottom view of a multichip module embodiment of the '671 disclosure in which the packages are diced so that more than one chip 120 is included in the resulting package. FIG. 1G-2 could also be the top view of the undiced packages, as shown in FIG. 1F. While the above process is shown and described in an embodiment that packages more than one chip simultaneously, the process could also be used to package an individual chip if desired.

Figure 2A:
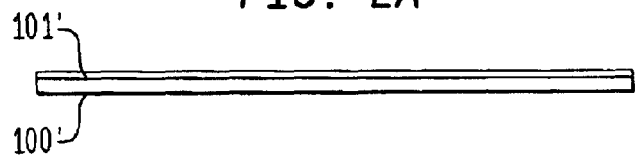
FIGS. 2A through 2E show a side view of an alternate method of manufacturing a semiconductor chip package, according to the present invention.
Figure 2B:
Figure 2C:
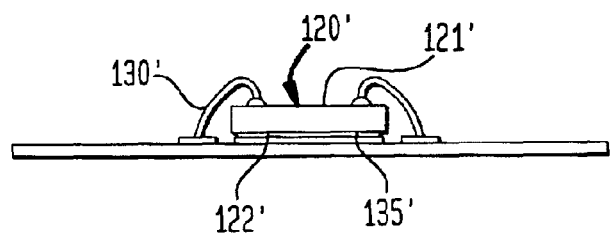
Figure 2D:
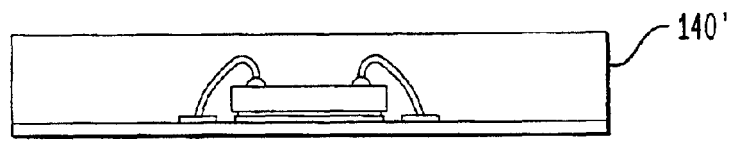
Figure 2E:
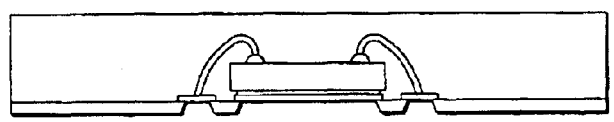
Figures 1, 1E, 2:
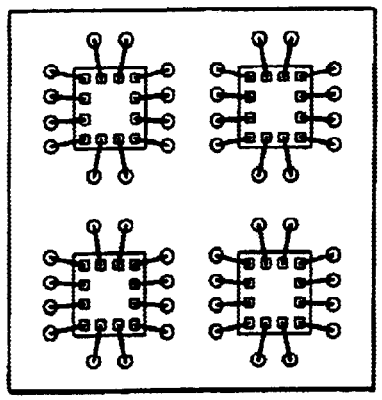
Figures 1, 1G, 2:
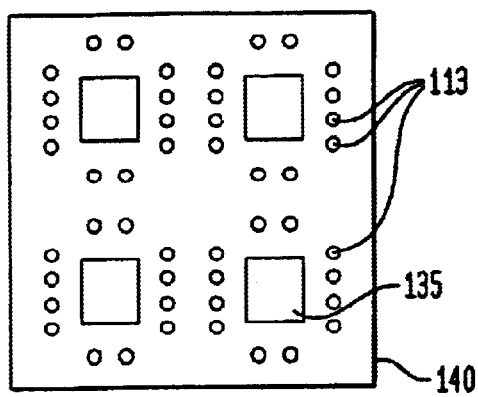
Figure 2F:
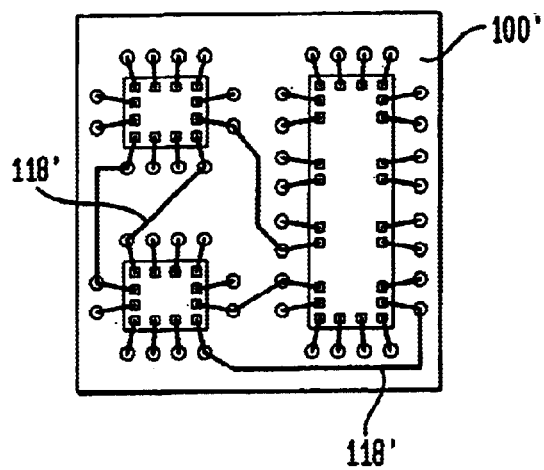
FIG. 2F shows a top view of a multichip package embodiment of FIG. 2E, according to the '671 disclosure.

In an alternative method of manufacture shown in FIGS. 2A–E, the sacrificial layer is comprised of a dielectric polymer sheet 100' having a conductive layer 101', typically a thin layer of copper, on one surface of the sacrificial layer 100', as shown in FIG. 2A. An array of conductive pads 110' are next photo-lithographically defined by etching away undesired sections of the conductive layer 101' so that the pads 110' define a central region 114' therebetween. Within the central region 114', a central conductive region 115' may also be defined by the pad-forming lithographic process, as shown in FIG. 2B. A back surface 122' of a semiconductor chip 120' is then bonded to the conductive region 115' through the use of the thermally conductive die attach adhesive 135', as discussed in reference to FIG. 1. The chip contacts (not shown) on the exposed face surface 121' of the chip 120' are then electrically connected to respective pads 110' by wirebonding wires 130' therebetween. As discussed above, the elements are next encapsulated in FIG. 2D using a suitable liquid encapsulant for the application and the encapsulant 140' is cured. Portions of the polymer sheet 100' are then removed, as by chemically etching or laser ablation operations, so that the pads 110' and central conductive region 115' are exposed. The packages may then be diced into either individual packages or multichip packages and connected to a PWB with conventional solder. Typically, the central region 115' is connected to the PWB in such a way that heat is drawn away from the chip into the PWB during operation of the package. As shown in the top plan view of FIG. 2F, a multichip package may include chips of different sizes that perform different functions. The addition of a dielectric, polymer sheet 100' allows this multichip module to have conductive paths 118' interconnecting at least some of the pads 110' within the multichip module thereby allowing signals to be transferred between the chips. It should be noted that if a wiring layer, such as is described in this multichip embodiment, is not needed or desired, the entire polymer sheet 100' may simply be removed by chemically dissolving the sheet leaving the pads and the central conductive region exposed.

Figure 3:
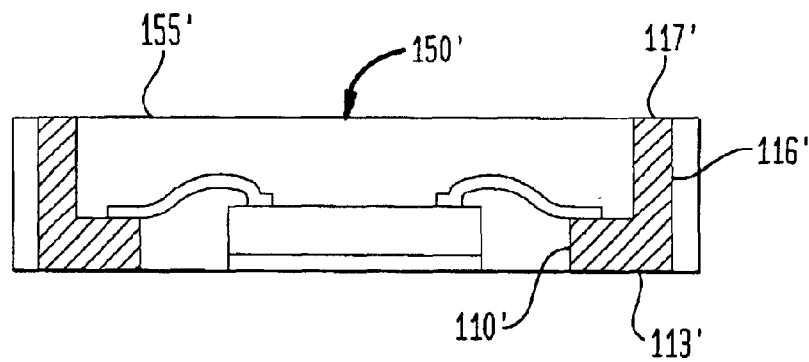
FIG. 3 shows a side view of a chip package having protrusions extending vertically from one side of the package to the other, the protrusions being electrically connected to at least some of the pads, according to the '671 disclosure.

FIG. 3 shows a still further embodiment of a packaged chip, similar to the packaged chips shown in FIG. 1G-1. In FIG. 3, however, a conductive protrusion 116' is electrically connected to a respective pad 110' and extends to the top surface 155' of the finished package 150' so that a top surface 117' of the protrusion 116' is exposed. This arrangement allows the bottom surface 113' of the pads 110' to be soldered to a supporting substrate (such as a PWB) while allowing another electronic component and/or semiconductor chip to be electrically connected to the packaged chip via the exposed top surface 117' of the protrusions 116'; thus, creating a chip stacking technique. The protrusions may extend from every pad; however, typically they will extend from less than all of the pads.

Figure 4A:
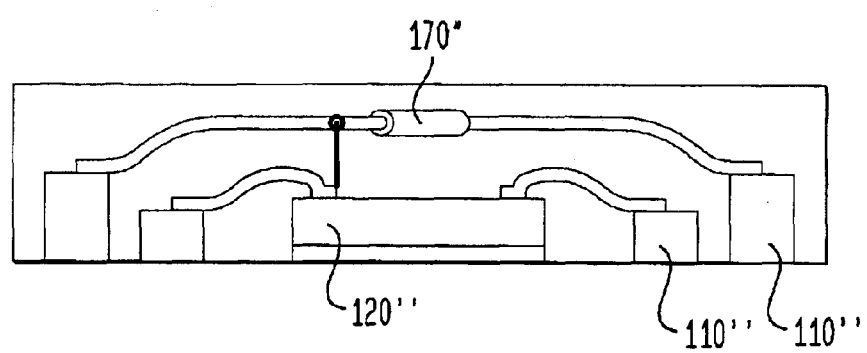
FIG. 4A shows a side view of a chip package having a second semiconductor chip back-bonded to the first chip such separate electronic component above the chip in the encapsulated package, according to the '671 disclosure.
Figure 4B:
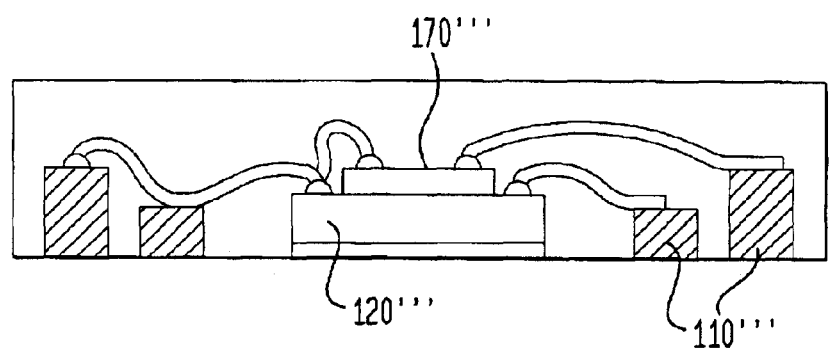
FIG. 4B shows a side view of a chip package having a second semiconductor chip back-bonded to the first chip such that the chip contacts of both chips and the pads may be interconnected, according to the '671 disclosure.

In a further embodiment, FIG. 4A shows a side view of a microelectronic component 170" which is attached to the chip 120". The contacts on such a microelectronic component may be electrically connected between respective contacts on the chip 120" and/or may be connected to respective pads 110". Where the microelectronic component is a second semiconductor chip 170''', as shown in FIG. 4B, the back surface of the second chip 170''' will be back-bonded to the face surface of the first chip 120''' and the contacts on the second chip may be electrically connected to the contacts on the first chip 120''' and/or to respective pads 110'''. The pads 110''' themselves may also be electrically interconnected.

Figure 5A:
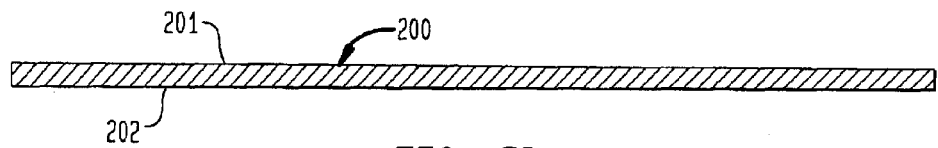
FIGS. 5A through 5H show a side view of an alternate method of manufacturing a semiconductor chip package, according to the '671 disclosure.
Figure 5B:
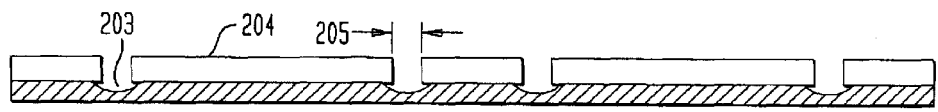

In a further alternative embodiment of the present '671 disclosure, shown by FIGS. 5A–H, the pads described above may have a more "rivet-like" shape. FIG. 5A shows a sacrificial layer, as earlier described, having a first surface 201 and a second surface 202. In FIG. 5B, a plurality of cavities 203 is removed from the first surface 201 of the sacrificial layer 200. Desirably, an etchable layer is used for the sacrificial layer so that the cavities 203 may simply be etched into the sacrificial layer 200 in the form desired. A second photo-imageable dielectric layer 204, such as standard photoresist, is disposed on top of the first surface 201 of the sacrificial layer 200 and apertures 205 are developed and removed using standard photolithographic techniques so as to control the creation and placement of the cavities.

Figure 5C:
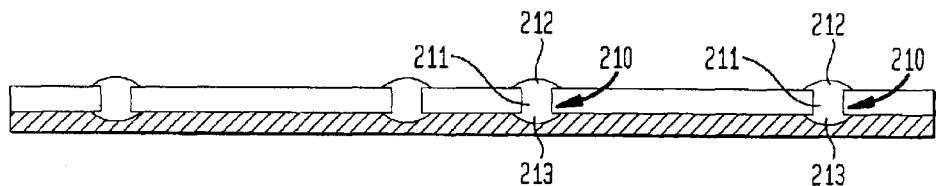

Conductive pads 210 are next plated into the cavities 203 and apertures 205 so as to create the rivet-like pads 210, as shown in FIG. 5C. These pads 210 have a bottom bump flange 213 adjacent to the sacrificial layer 200 and integrally attached to a post pad 211 such that the post pad protrudes from the bump flange 213. A second bump flange 212 is integrally attached to the opposite end of the post pad 211. Both bump flanges 212/213 have flange areas that extend beyond the diameter of the post pad 211. FIGS. 5I–5J show alternate cross-sectional pad configurations, according to the present invention. In the embodiment shown in FIG. 5I, the pad is comprised of the bottom bump flange 213' and the post pad 211', depicted in conjunction with sacrificial layer 200'. In FIG. 5J, the bump flanges 212" and 213", shown in conjunction with post pad 211" and sacrificial layer 200", are more squared off at the edges when compared to the rounded/oval bump flanges shown in the other figures. Other shape bump flanges may also be used.

Figure 5D:
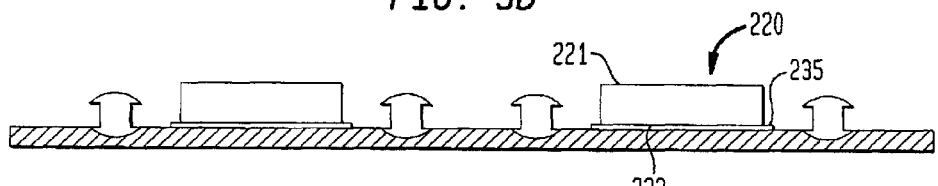
Figure 5E:
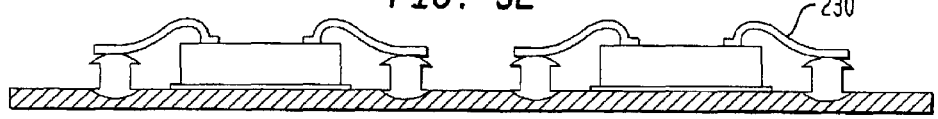
Figure 5F:
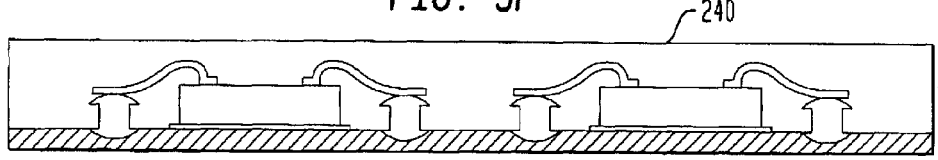
Figure 5G:
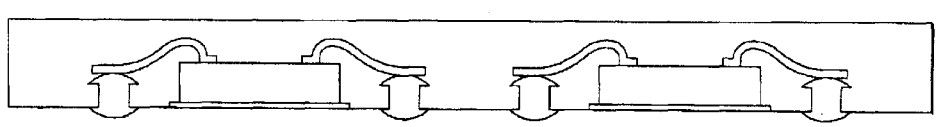
Figure 5H:
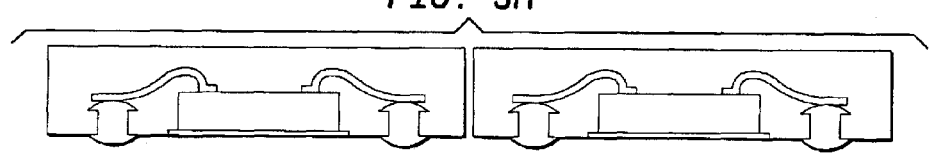
Figure 5I:
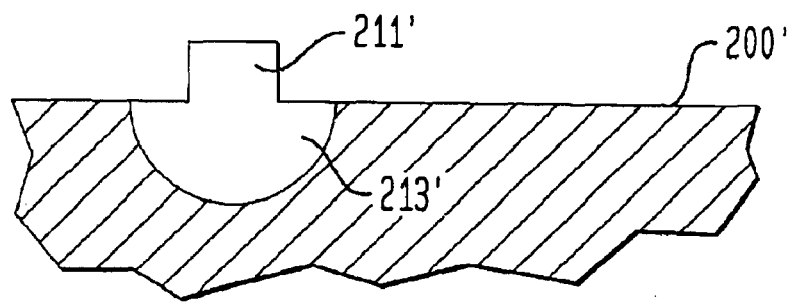
FIGS. 5I and 5J show a side view of alternate embodiments of the pad/post structure shown in FIGS. 5A through 5H, according to the '671 disclosure.
Figure 5J:
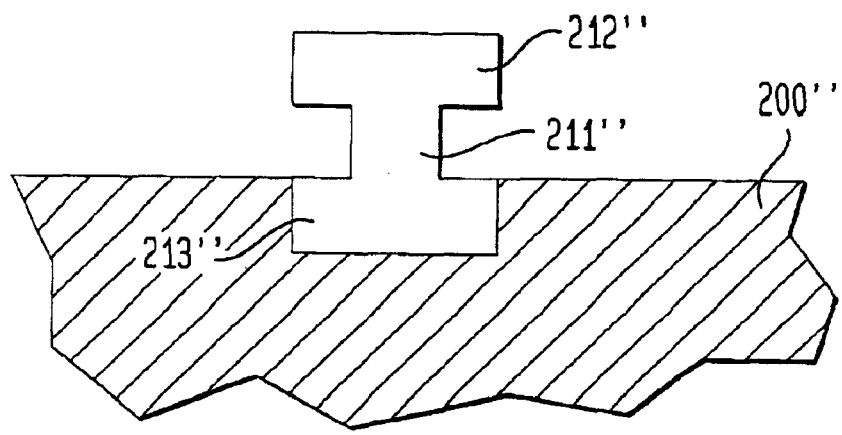

In FIG. 5D, the photo-imageable layer 204 is removed leaving the pads 210 such that the pads within a particular group define a central region therebetween. A chip 220 is next back-bonded to the first surface of the sacrificial layer 200 using a thermally conductive die attach adhesive 235, as described in the previous embodiment. FIG. 5E shows electrical connections 230 interconnecting the chip contacts (not shown) on the face surface 221 of the chip 220 and the pads 210. The electrical connections 230 are made by using a wirebonder to stitch bond both ends of the wire to the pad 210 and the chip contacts. The stitch bonds create a low profile electrical connection between the contacts and the pads that, in turn, allows the finished package to be thinner. The pads 210, chip 220, and wires 230 are then encapsulated using an encapsulant 240, as described above in reference to FIG. 1 and further shown in FIG. 5F. The sacrificial layer is next etched away to expose the bottom bump flange 213, as shown in FIG. 2G. The packaged chips are then diced into either individual packaged chips or packaged multichip modules, as shown in FIG. 5H.

In a still further embodiment, FIGS. 6A–6F show another stackable chip arrangement. FIG. 6A-1 shows a side view in which a dielectric base material layer 305 is disposed on a top surface 302 of a sacrificial layer 300. The base material 305 is preferably comprised of a dielectric sheet-like layer, such as polyimide. Typically, the base material 305 is laminated onto the sacrificial layer 300. Conductive pads 310 are disposed on the base material 305. The pads 310 may be plated on the base material 305 prior or subsequent to the base material's attachment to the sacrificial layer 300. FIG. 6A-2 shows a top plan view of FIG. 6A-1. The pads 310 in FIG. 6A-2 have bonding sites 315 and via sites 316. The pads 310 further define a central cavity 314. As shown in FIG. 6B-1, a semiconductor chip 320 is then back-bonded to the first surface 302 of the sacrificial layer 300 within the central cavity. The chip contacts (not shown) are next electrically connected to respective bonding sites 315 on the pads 310. Typically, the contacts are connected to the respective bonding sites 315 by wire bonds 330. FIG. 6B-2 shows a top plan view of FIG. 6B-1.

As shown in FIG. 6C, a curable, liquid encapsulant 340 next encapsulates the chip, pads and wires and is cured, as described above. A second conductive sacrificial layer 345 is then disposed on the exposed surface of the encapsulant 340. The second sacrificial layer 345 is typically laminated onto the encapsulant 340. As shown in FIG. 6D, apertures 350 are next drilled through the cured dielectric material such that the aperture sidewalls extend through the package from a top surface to a bottom surface thereby creating a via through at least some of the conductive pads 310 at the via sites 316. As shown in FIG. 6E, the sidewalls 355 of the apertures 350 are next plated with a conductive metal 360 so that a conductive path is created from one side of the aperture to the next extending completely through the package. The conductive metal 360 typically terminates on either side of the aperture 350 in flange portions 365. The shape and size of the flange portions are controlled through standard photolithographic means in which a dielectric photoresist 363 is applied to the second sacrificial layer and developed so that the flange area may be removed therefrom. The photoresist also allows the selective plating of a thermally conductive metal layer 368 on the second surface 301 of the first sacrificial layer 300.

As shown in FIGS. 6F-1 and 6F-2, the first sacrificial layer 300 and the second sacrificial layer 345 are both etched such that only the portions under the flange portions 365 and the metal layer 368 remain. Alternately, the second sacrificial layer 345 could be selectively etched and used either as a ground/power layer or a wiring layer. The flange portions 365 and metal layer 368 are made of a material that is resistant to the etching solution used to etch the sacrificial layers. The plated conductive vias are next filled with conductive material 370, such as solder or metal-filled epoxy, so that the conductive material 370 protrudes from the bottom of the vias 371 and at the top of the vias 372. This arrangement allows the bottom of the via to be electrically connected to a PWB while also allowing the top of the via 372 to be connected to another chip package as in a vertical chip stacking arrangement. The metal layer may be connected to a heat sink in the PWB so that heat may be directed away from the chip during operation. If the combination of the first sacrificial layer 300 and the metal layer 368 are thick enough, they may also serve the function of stretching any solder connections between the package and the PWB in order to obtain solder columns which are more able to withstand the expansion and contraction of the package/PWB during thermal cycling of the chip 320.

Figure 7A:
FIGS. 7A through 7E show a side view of an alternate method of manufacturing a semiconductor chip up to the encapsulation step, according to the '671 disclosure.
Figure 7B:
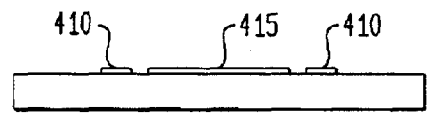
Figure 7C:
Figure 7D:
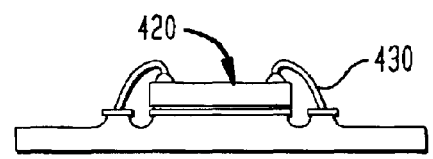
Figure 7E:
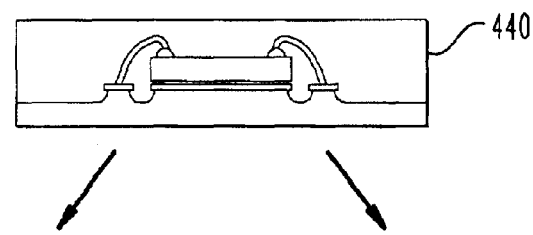

A still further embodiment of the '671 disclosure is shown in FIGS. 7A–7G. In FIG. 7A, a sacrificial sheet 400 comprised of copper is first provided. Next, gold is selectively electroplated onto the first surface 401 of the sacrificial sheet 400 so as to define pad regions 410 and a central conductive region 415 positioned between the pad regions 410, as shown in FIG. 7B. The second surface 402 of the sacrificial sheet 400 is then covered with a photoresist 418, as shown in FIG. 7C, and the first surface 401 of the sacrificial sheet 400 is etched. The etchant used should etch the sacrificial sheet more readily than it etches the gold pads/central region. Cupric chloride is one such etchant which might be used if the sacrificial sheet is comprised of copper. The controlled etching process causes the pads 410 and central region 415 to protrude from the surface of the sacrificial sheet 400. One skilled in the art will appreciate that other materials may be used for the sacrificial sheet 400 and pads/central region 410/415 to achieve the same results. As shown in FIG. 7D, a semiconductor chip 420 is next back-bonded to the central region 415 and the chip contacts (not shown) on the exposed surface of the chip 420 are electrically connected to respective pads 410 using a wire-bonding machine to attach the wires 430 therebetween. The next step in the process, shown in FIG. 7E, includes encapsulating the elements of the chip package with a suitable curable, liquid encapsulant 440 and subsequently curing the encapsulant 440.

Figures 1, 7F:
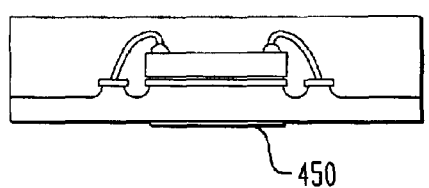
Figures 2, 7F:
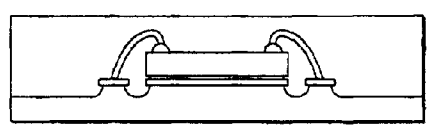
Figures 1, 7G:
Figures 2, 7G:

At this point, one of two different paths can be followed. First, as shown in FIGS. 7F-1 and 7G-1, a gold region 450 is selectively electroplated on the exposed surface of the sacrificial sheet 400 and the sheet is etched so that only the pads 410 and the central region 415 remain. In this case, the central region protrudes from the bottom of the package allowing it to be more easily attached to a PWB to provide a direct heat path away from the chip during operation of the device. The protruding central region 415 may also provide a method to stretch the solder balls attaching the exposed pads 410 to the PWB into solder columns so that they are more able to withstand the differential expansion and contraction of the package/PWB during operation of the device. With the second path, as shown in FIGS. 7F-2 and 7G-2, the sacrificial sheet 400 is etched such that the pads 410 and central region 415 are planar with respect to the bottom of the package. The device may then be electrically connected to a PWB through the pads 410 and thermally connected to the PWB through the central region 415. In an alternate embodiment, the pads 410 may be etched during the sacrificial sheet etching step to create a cavity feature within each pad. These cavities may be used to facilitate solder ball placement on the pads 410.

Variants of the methods described above for manufacturing a semiconductor package are also applicable to resistor manufacturing. As is known in the art, a resistor is a component that has electrical resistance. Resistors can be used to control the flow of current and/or to provide a desired voltage-to-current relationship.

FIGS. 8A–8I show an inexpensive method of manufacturing resistors according to the present invention. FIG. 8A shows a side view of a sacrificial layer 800 having a first surface 801 and a second surface 802. The sacrificial layer 800 may be comprised of an electrically conductive metallic material, a polymer material or a combination of both a conductive metallic material and a polymer material. In the particular embodiment illustrated in FIGS. 8A–8I, the sacrificial layer is formed from an electrically conductive material such as a metal. Examples of conductive sacrificial layer materials include aluminum, copper, steel, iron, bronze, brass, and alloys and combinations thereof.

As shown in FIG. 8B, an apertured layer 803 is applied across the first surface 801 of the sacrificial layer 800. The apertured layer 803 desirably is formed from a material which is substantially resistant to the etchant used to etch the sacrificial layer as discussed below. The apertured layer can be provided with apertures 804 before uniting the apertured layer with the sacrificial layer, as by punching or drilling apertures in a preformed solid layer such as a solid sheet of polymer or metal, or by forming the layer with the apertures in a conventional mold such as an injection mold or compression mold. The apertured layer may be formed in place on the first surface 801 by applying a continuous layer of a patternable material such as a photoresist onto the first surface 801 of the sacrificial layer and exposing the patternable material to light or other radiation in a pattern corresponding to a positive or negative image of the apertures to be formed, depending upon the type of photoresist employed. The photoresist is then developed and processed form apertures 804 using standard photo-lithographic techniques so as to control the creation and placement of cavities. The apertured layer may also be formed by selectively depositing the etch-resistant material onto the first surface of the sacrificial layer as, for example, by screen printing the material in a fluid condition using a process which leaves uncoated spots on the surface, and then curing the deposited material to form a solid layer with apertures at the uncoated spots. The apertured layer may also be a reusable mask.

As shown in FIG. 8C, portions of the sacrificial layer 800 aligned with the apertures 804 of the apertured layer 803 are removed, such as by using an etching process, in order to create cavities 805 within the sacrificial layer 800. The cavities 805 may be formed in single rows on the first surface 801 of the sacrificial layer 800 or in any other desired pattern, in a similar fashion to the arrangement shown in FIG. 1D-2. The cavities 805 form depressions in the first surface 801 of the sacrificial layer 800 extending toward the second surface 802 thereof. The size and shape of the cavities 805 may be controlled by controlling the etching process utilized. For example, where the sacrificial layer is formed from aluminum, the first surface 801, with apertured layer 803 thereon, can be exposed to an alkaline etch solution. Increasing the exposure time increases the size of the cavities. Preferably, the second surface 802 of the sacrificial layer is protected from the etchant during this stage of the process, as by a suitable temporary coating or fixture (not shown).

As shown in FIG. 8D, a layer of a first conductive material 806 is then deposited in the cavities 805, such as by using a deposition, plating or immersion coating process. The first conductive material 806 can be copper, gold, nickel, platinum or other metal that can be deposited. The first conductive material 806 preferably is resistant to the etchant which is used to remove the sacrificial layer in a subsequent stage of the process discussed below. The first conductive material also should be resistant to chemicals used to remove the apertured layer as discussed below. Most preferably, the first conductive material is a material which can be readily soldered during use of the finished resistor.

Next, as shown in FIG. 8E, a second conductive material is deposited in each cavity 805 to form conductive pads 807 which include both the first conductive material 806 and the second conductive material. The second conductive material may be comprised of conductive materials such as copper, or highly conductive materials such as silver or gold. The advantage of using highly conductive materials such as silver or gold is that their surface or contact resistance does not change greatly. For example, gold does not become oxidized, and silver remains very conductive after it becomes oxidized. The second conductive material is deposited in each cavity 805 atop the first layer of conductive material 806, preferably by electroplating.

Where the sacrificial layer is aluminum, a first conductive material 806 may not be required. In such a case, an immersion coating process is performed wherein the aluminum is coated with zinc by autoreduction of zinc ions in solution onto the exposed aluminum. This process is performed so that the aluminum sacrificial layer can be directly platable. When a polymer material is used for the sacrificial layer, the second conductive material is deposited in each cavity 805 atop the seed layer.

Each pad 807 has a bottom bump flange 808 adjacent to the sacrificial layer 800 and a post 809 such that the pad 809 protrudes upwardly from the bottom bump flange 808, through an aperture 804 in the sacrificial layer. A top bump flange 810 is integrally attached to the opposite end of the post 809. Both bump flanges 810 and 808 have flange areas that extend beyond the diameter of the post 809. The top bump flange 810 extends over the apertured layer 803. Stated another way, the flanges 810 and 808 of each pad 807 are wider than the post 809 of such pad. Thus, the conductive pads 807 are generally rivet-shaped. The alternate cross-sectional pad configurations discussed above with reference to FIGS. 5I and 5J also can be used.

Referring to FIG. 8F, the apertured layer 803 is then removed from the first surface 801 of the sacrificial layer 800. If the apertured layer 803 is a photoresist, a suitable photoresist stripper is employed to remove the photoresist. If an etching solution is used to remove the photoresist, the etching solution need only be capable of removing the particular photoresist being used. The type of etching solution varies depending on the metal used for the photoresist. If a copper apertured layer is used, acidic cupric chloride or ammonical copper etching solutions could be used to remove the copper photoresist. If an aluminum apertured layer is used, a caustic solution with additives to control etch activity will work. The etchant used to remove the apertured layer preferably does not appreciably attack the conductive material or materials in the pads 807, or the sacrificial layer 800.

After the apertured layer 803 has been removed, the top bump flanges 810 are spaced above the first surface 801 of the sacrificial layer 800. Next, as shown in FIG. 8G, a resistive material is deposited over the first surface 801 of the sacrificial layer 800 such that a resistive layer 811 covers the first surface 801 of the sacrificial layer 800 and the conductive pads 807. The resistive material may be comprised of any conductive or semiconductive material. Most preferably, the resistive material is applied in a liquid, paste or other flowable condition, and cured to form a solid mass. In a preferred embodiment, the resistive material is comprised of conductive particles such as one or more metals, graphite or other carbon particles dispersed in a polymeric resin, fusible glass or other binder. To vary the bulk resistivity of the resistive material, the size and composition of the conductive particles, and the proportion of conductive particles in the resistive material, can be varied. Two or more types of resistive particles can be employed. The binder also may include mixtures of two or more materials. The resistive material can be deposited using an injection molding process. The resistive material can also be deposited using methods such as spin coating, casting, roller or doctor blade coating, silk-screening, stenciling and compression molding. In the particular process depicted in FIGS. 8A–8I, the resistive material is applied as a single continuous layer. Upon curing of the resistive material, the resistive material and pads form a single unit, with the top bump flanges 810 and posts 809 of all of the pads 807 being embedded in the mass 811.

Then, as shown in FIG. 8H, the sacrificial layer 800 is removed to expose the bottom bump flanges 808. The sacrificial layer 800 can be removed using processes such as chemical etching or plasma etching (wet or dry). While an etching process is the preferable method of separating the sacrificial layer 800, any other procedure capable of removing the sacrificial layer without destroying the unit including the resistive material and pads can be employed. For example, the sacrificial layer may be more selectively removed, leaving portions of the sacrificial layer in place but still exposing the conductive pads. The remaining portions of the sacrificial layer provide added features on the bottom of the finished resistor, such as a heat sink disposed beneath and protruding from the bottom of the finished resistors. Where the cured resistive material and pads do not strongly adhere to the sacrificial layer, or where the adhesion can be released without destroying the unit including the resistive material and pads the sacrificial layer 800 can be peeled away from the unit, preferably without destroying the sacrificial layer. Differential expansion in materials may cause the sacrificial layer 800 to become separated from the resistive layer 811 and the conductive pads 807. For example, the material constituting the pads 807, such as the first conductive material 805 immediately adjacent to the sacrificial layer, may have a high coefficient of thermal expansion (CTE), and sacrificial layer 800 may be formed from polished stainless steel. In this case, the conductive material 805 would not adhere well to the stainless steel sacrificial layer 800, and the expansion of the material 805, during a process of applying the resistive material such as injection molding, would cause separation of the sacrificial layer 800 and the resistor unit. In another alternative, the conductive material forming the interface between the pads and the sacrificial layer may have a melting temperature below the melting and degradation temperatures of the other elements in the unit, so that the pads can be separated from the sacrificial layer 800 by bringing the assembly to an elevated temperature.

As shown in FIG. 8H, the exposed bottom bump flanges 808 remain coated with the first conductive material layer 806 described above in reference to FIG. 8D. This material 806 enhances the solderability of the conductive pads 807.

The resistance of the resulting device can be varied based upon which bottom bump flanges 808 are connected. A greater resistance can be created by increasing the distance between connected bottom bump flanges 808.

Finally, as shown in FIG. 8I, the unitary resistive layer 811 can be cut, severed, diced or laser trimmed to subdivide the single unit into a plurality of individual resistors, each including a portion of the resistive layer and two or more of the conductive pads 807. The resistive layer 811 of FIG. 8H has been cut into four separate resistors 812A, 812B, 812C and 812D. Although four resistors have been manufactured in FIG. 8I, any number of resistors may be formed. Alternatively, the subdividing step may be omitted, and the unit including the entire resistive layer 811 may be used as a single resistive element.

The process described above can be varied. For example, cavities 805 in the sacrificial layer can be formed by processes other than by etching through the apertures in the apertured layer. For example, the cavities can be formed using an embossing tool or stamping die, or the sacrificial layer can be cast or otherwise formed with the cavities in the first surface. An apertured layer with pre-formed apertures can be assembled to the sacrificial layer so that the apertures are in alignment with the cavities. Alternatively, a patternable layer such as a photoresist can be applied onto the first surface and subsequently patterned to form the apertures.

Processes other than electroplating can be employed to deposit the conductive material or materials in the cavities and in the apertures of the apertured layer. For example, a metal-filled polymer material can be used instead of a second conductive material. The metal-filled polymer material can be deposited into the cavities by using a squeegee followed by a uniform coating with a doctor blade to planarize. The metal-filled polymer material fills each cavity 805 and aperture 804, so as to form the bottom flanges 808 and posts 809 of the conductive pads 807. Additional conductive metal-filled polymer then can be applied in spots on the top surface of the apertured layer 803, as by silk-screening, to form the top flanges 810 of the pads. Alternatively, the amount of metal-filled polymer applied in each cavity and aperture may be slightly greater than the volume of such cavity and aperture, so that the excess forms the top flange 810.

The sacrificial layer 800 need not be formed from an electrically conductive material. Materials such as nonconductive polymers can be employed. The polymer sacrificial layer can be removed from the resistive unit by laser or water jet erosion or drilling, or by dissolving the sacrificial layer using a solvent which does not substantially attack the cured resistive material. Polymeric sacrificial layers with cavities can be formed, for example, by injection molding, thermoforming, compression molding and the like. When a non-conductive material is used for the sacrificial layer, and where electroplating is used in subsequent steps of the process, an electrically conductive coating or "seed layer" may be applied on the first surface, including those portions of the first surface defining the cavities. The seed layer may include nickel, chromium, a nickel-copper alloy such as Monel® or another suitable alloy vacuum deposited or sputter-deposited on the first surface of the polymer sacrificial layer, or electrolessly plated onto the first surface. If the material of the seed layer adheres to the finished resistor unit after removal of the sacrificial layer, the seed layer may be removed by a brief etching process or microelectronic-abrasive pressure blast.

Figure 9A:
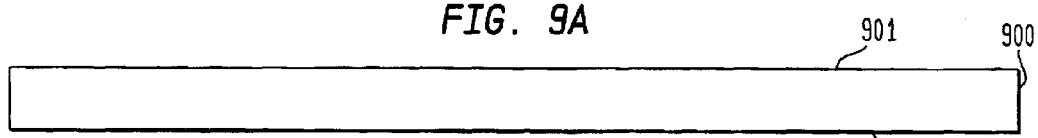
FIGS. 9A through 9H are diagrammatic sectional views depicting successive stages in a method of making resistors, according to another embodiment of the present invention.
Figure 9B:
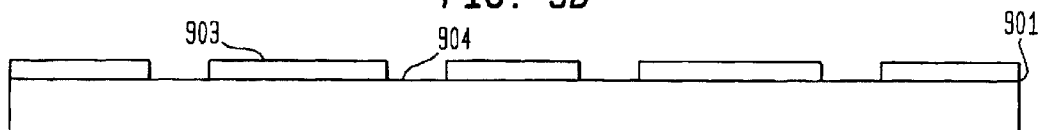
Figure 9C:
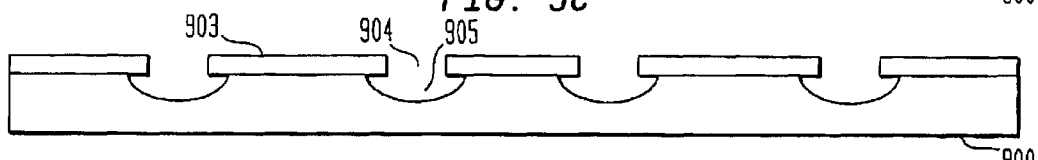

FIGS. 9A–9H show another method of manufacturing resistors according to the present invention. In this process as well, the sacrificial layer 900 (FIG. 9A) has a first surface 901 and a second surface 902. The sacrificial layer 900 may be comprised of any of the materials discussed above. As shown in FIG. 9B, an apertured layer 903 is applied across the first surface 901 of the sacrificial layer 900 using one of the methods previously discussed. As shown in FIG. 9C, portions of the sacrificial layer 900 aligned with the apertures 904 of the apertured layer 903 are removed in order to create cavities 905 within the sacrificial layer 900. As previously discussed, the cavities 905 can be formed using an etching process with apertured layer 903 serving as an etch mask, or can be formed before the apertured layer is placed on the first surface. As previously discussed, the cavities may be formed in rows in the first surface of the sacrificial layer 800 or in any other pattern.

Figure 9D:
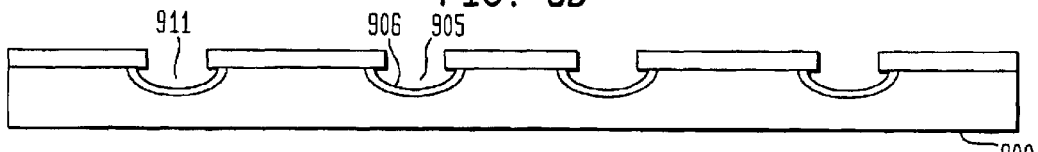

Next, as shown in FIG. 9D, one or more metals are deposited into the cavities 905 to form pads in the shape of hollow shells 906 within the cavities. The hollow shells have interior spaces 911 open to the first surface 901 of the sacrificial layer. The metal which is deposited first will form the outer surface of the pad and accordingly should be a readily solderable metal such as gold, copper, or nickel. This first metal should be platable and resistant to etch chemicals used to remove the sacrificial layer in a later stage of the process. The entirety of each shell may be formed from a single metal. In other embodiments, a film of a first metal is applied first, followed by a further layer of a second metal defining the interior surface of the shell, facing toward the interior space.

Figure 9E:
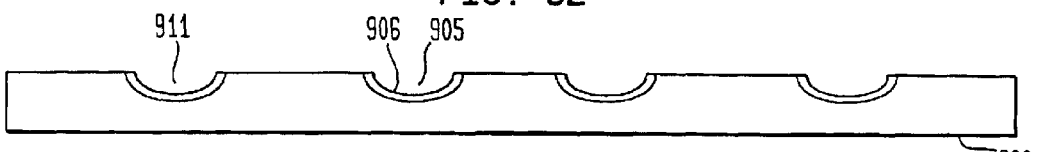
Figure 9F:
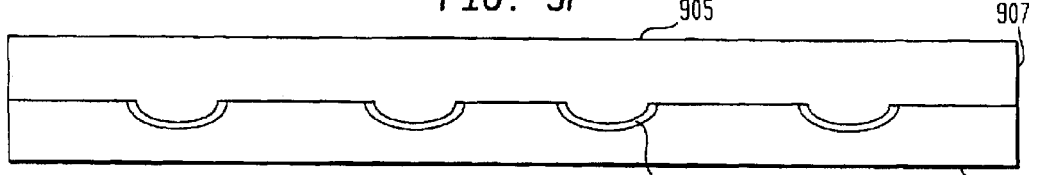

After formation of the shells 906 the apertured layer 903 is removed from the first surface of the sacrificial layer 900, as shown in FIG. 9E. Next, as shown in FIG. 9F, a layer 907 of resistive material is deposited, using any of the methods previously described, over the first surface 901 of the sacrificial layer 900 such that the resistive layer 907 covers the first surface 901 of the sacrificial layer 900 and fills the interior spaces 911 of the shells. Thus, each shell or pad 906 and the resistive material 908 (FIG. 9G) within the shell forms a projection extending from the bottom surface of the resistive layer.

Figure 9G:
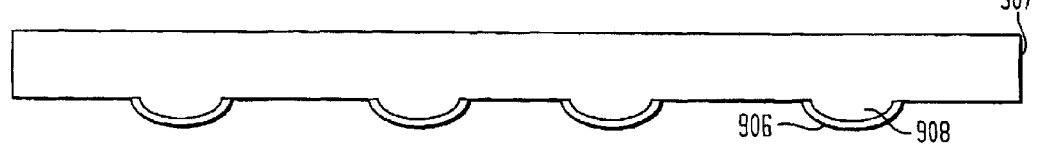
Figure 9H:
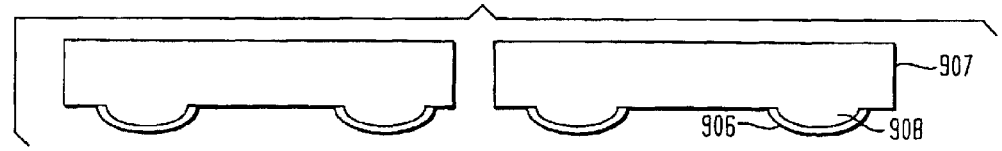

Then, as shown in FIG. 9G, the sacrificial layer 900 is removed from the unit including the resistive layer and pads, using any of the methods previously described. As previously discussed, the sacrificial layer may be selectively removed, leaving portions of the sacrificial layer in place to provide added features on the bottom of the unit, such as a heat sink disposed beneath and protruding from the bottom of the finished product. Finally, as shown in FIG. 9H, the resulting resistor unit can be subdivided into a plurality of individual resistors, although the entire unit as shown in FIG. 9G can also be used as the finished product.

In a variant of the process depicted in FIGS. 9A–9H, the apertured layer 903 may be left in place when the resistive material is deposited, so that the resistive material is filled into the interior spaces 911 of the shells 906 through the apertures 904. The apertured layer can be stripped away after removal of the sacrificial layer from the resistive unit. However, where the apertured layer is a dielectric, the apertured layer can be left in place and may form part of the finished product. If the unit is subdivided, the apertured layer can be subdivided along with the resistive layer.

Figure 10A:
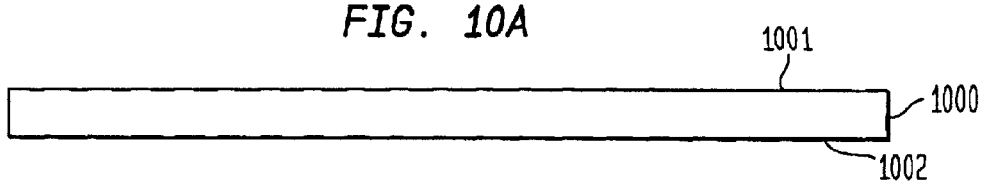
FIGS. 10A through 10G are diagrammatic sectional views depicting successive stages in a method of making resistors, according to a further embodiment of the present invention.
Figure 10B:
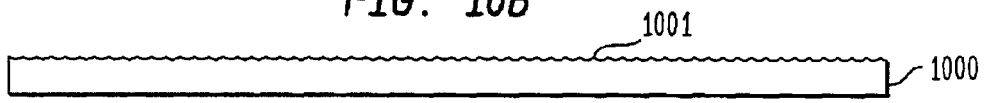

FIGS. 10A–10E show still another process for manufacturing resistors according to the present invention. FIG. 10A shows a side view of a sacrificial layer 1000 having a first surface 1001 and a second surface 1002. The sacrificial layer 1000 may be comprised of a conductive material, desirably a metallic material. As shown in FIG. 10B, in order to prepare the sacrificial layer 1000 for further processing steps, the first surface 1001 of the sacrificial layer 1000 optionally is roughened or otherwise treated to enhance adhesion of the resistive layer to the sacrificial layer. For example, the first surface may be roughened by sanding, sandblasting, or other conventional mechanical processes. Alternatively, the first surface may be roughened by electroplating this surface with a metal such as nickel under conditions which promote formation of a rough, dendritic plating deposit.

Figure 10C:
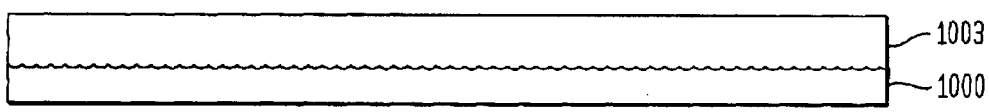

As shown in FIG. 10C, resistive material is then deposited onto the first surface 1001 of the sacrificial layer 1000 to form a resistive layer 1003. The resistive material can be deposited in a fluid condition as discussed above, or else may be in a substantially solid condition. For example, a solid layer of resistive material can be laminated with the sacrificial layer under conditions such as heat and pressure which promote adhesion of the resistive layer and the sacrificial layer.

Figure 10D:
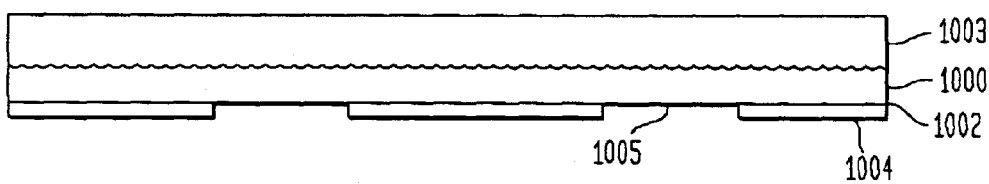
Figure 10E:
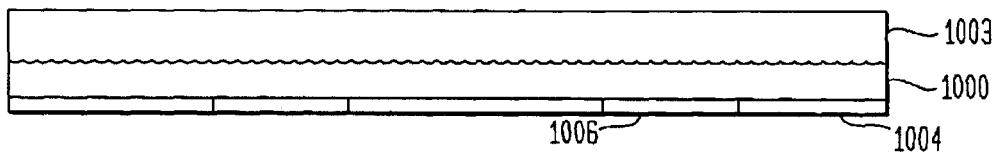

Next, an etch-resistant material 1006 is deposited onto the second surface 1002 at locations where pads are to be provided in the finished unit. For example, as shown in FIG. 10D, an apertured layer 1004 is applied across the second surface 1002 of the sacrificial layer 1000, as, for example, by applying a continuous layer of a patternable material such as a photoresist and exposing and developing the photoresist to form apertures 1006 in the locations where the pads are desired. Then, as shown in FIG. 10E, a relatively etch-resistant conductive cover material 1006 is applied on the second surface 1002 of the sacrificial layer 1000 in the apertures 1005, using any of the methods of depositing conductive materials disclosed herein or known in the art. The conductive cover material 1006 desirably is a metal such as gold, osmium, rhodium, platinum, tin, nickel, chromium and alloys thereof. Preferably, the conductive cover material is a metal which can remain as part of the pads in the finished unit, for example, where the cover material desirably is a readily solderable metal.

Figure 10F:
Figure 10G:
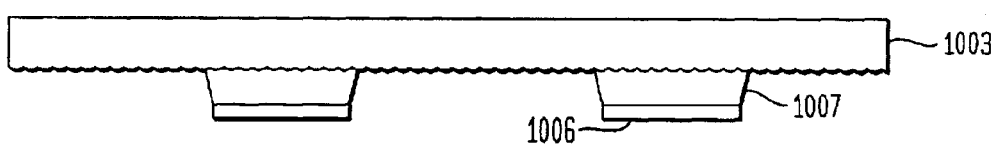

As shown in FIG. 10F, the apertured layer 1004 is removed from the second surface 1002 of the sacrificial layer 1000 using any of the methods previously discussed or known in the art. Finally, as shown in FIG. 10G, the sacrificial layer 1000 is etched so that a plurality of electrodes 1007 remains. The etch-resistant cover material 1006 protects portions of the sacrificial layer. Those protected portions form the electrodes. In a variant of this process, the cover material is a photoresist or other material which does not form part of the completed pads. In this embodiment, the cover material is removed after the etching step.

Figure 11A:
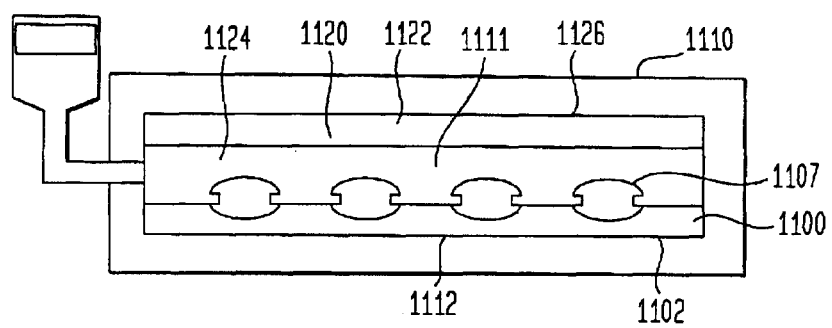
FIGS. 11A through 11E are diagrammatic sectional views depicting successive stages in a method of making resistors, according to yet another embodiment of the present invention.

FIGS. 11A–11E show another method of manufacturing resistors according to the present invention. As shown in FIG. 11A, the sacrificial layer 1100 and the conductive pads 1107, similar to those shown in FIG. 8F, are placed in the interior 1111 of injection mold 1110, such that the second surface 1102 of the sacrificial layer 1100 lies on one interior surface 1112 of the injection mold 1110. An insulating layer 1120 having a first or top surface 1122 and a second or bottom surface 1124 is also placed in the interior 1111 of the injection mold 1110, such that the first surface 1122 of the insulating layer 1120 faces an interior surface 1126 of the injection mold 1110 opposite from surface 1112. The insulating layer can be comprised of materials such as ceramic, glass or a high temperature plastic. Preferably, the insulating layer 1120 has a coefficient of thermal expansion similar to that of the resistive material.

The insulating layer 1120 and sacrificial layer 1100 are secured to the mold 1110 by appropriate holding devices (not shown); by applying a vacuum through ports (not shown) in mold surfaces 1126 and 1112; or by adhesives. Preferably, the adhesives used are adapted to degrade or release their bond upon application of heat. Because the sacrificial layer 1100 rests on an upwardly-facing, horizontal mold surface 1112 in the particular arrangement illustrated, the sacrificial layer may be held in place by gravity.

Figure 11B:
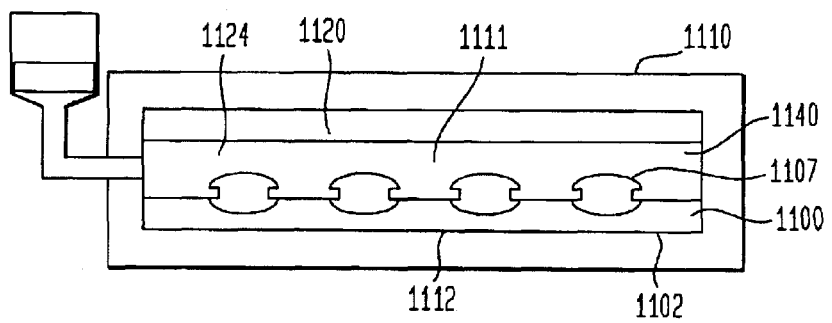

As shown in FIG. 11B, a resistive material is injected into the interior 1111 of the injection mold 1100 between the first surface 1101 of the sacrificial layer 1100 and the second or bottom surface 1124 of the insulating layer 1120 such that the bottom surface 1124 of the insulating layer 1120, the conductive pads 1107 and the first surface 1101 of the sacrificial layer 1100 are covered by the resistive material. The injection-molded resistive material forms resistive layer 1140. Thus, the resistive layer 1140, conductive pads 1107 and insulating layer 1120 form a unit 1160.

Figure 11C:
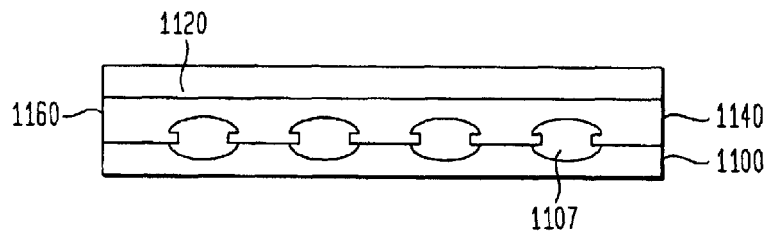

Next, as shown in FIG. 11C, the resulting unit 1160 and the sacrificial layer 1100 are removed from the injection mold 1110. When the top surface 1122 of the insulating layer 1120 is secured to the upper inner surface 1126 of the injection mold 1110 through the use of a heat releasable adhesive, and where the resistive material 1140 is injected at elevated temperature, the adhesive bond is released to a nonadherent material at molding temperature, facilitating the removal of the molded device 1160 from the injection mold 1110. When the insulating layer 1120 and/or sacrificial layer is held in the mold by vacuum, the molded unit 1160 can be ejected from the injection mold 1110 using positive air pressure applied through the vacuum ports. Other conventional techniques for ejecting a part from an injection mold can be employed. Once the molded unit 1160 has been removed from the injection mold 1110, as shown in FIG. 11C, the sacrificial layer may be removed to expose the bottom bump flanges 1108 using the methods described above.

Figure 11D:
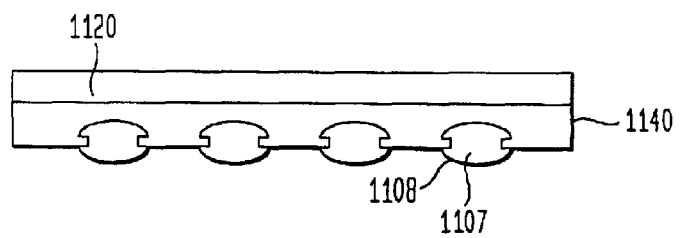
Figure 11E:
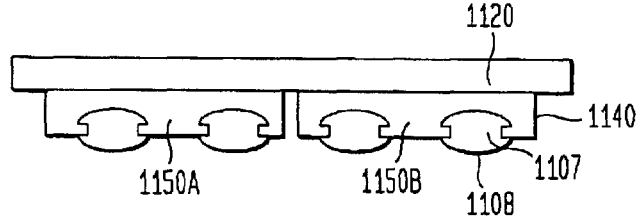

As shown in FIG. 11D, the insulating layer 1120 acts as a common base, so that the resulting resistive layer 1140, the conductive pads 1107 and the insulating layer 1120 form an integrated passive device. As shown in FIG. 11E, the resistive material of the unit can be subdivided, as by cutting, sawing, or laser trimming, to provide a plurality of individual resistors 1150A, 1150B mounted on the same insulating layer 1120. The individual resistors 1150A, 1150B and the insulating layer 1120 together form an integrated passive device. Alternatively, the entire unit, including the insulating layer, can be subdivided, as by cutting through the insulating layer and the resistive layer, to form a plurality of separate units, each including a portion of the resistive layer, a portion of the insulating layer, and a plurality of conductive pads.

A similar process can be performed using sacrificial layers having other configurations as, for example, using the sacrificial layer and pads shown in FIG. 9E and the sacrificial layer of FIG. 10B. In each case, the step of applying the resistive layer can be performed using the injection molding process discussed above with reference to FIGS. 11A–11E. Also, the injection molding process can be used without the insulating layer.

Figure 12:
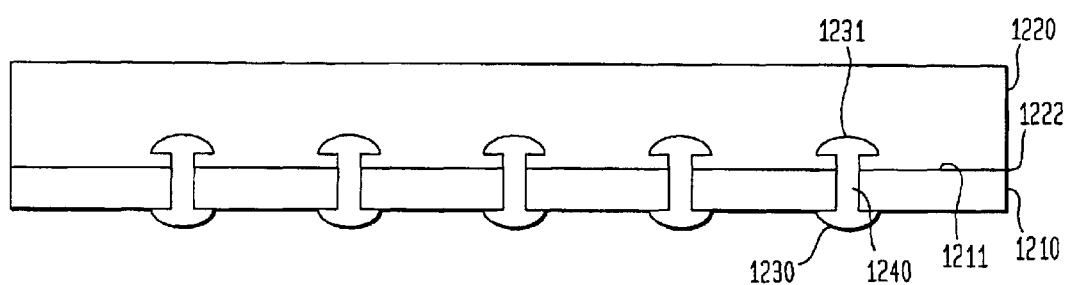
FIG. 12 is a diagrammatic sectional view depicting a resistor in accordance with yet another embodiment of the present invention.

In an alternative embodiment, as shown in FIG. 12, a non-conductive apertured layer 1210, which is thicker than the patternable layer used in the embodiments shown in FIGS. 8A–8I, is applied across the first surface of the sacrificial layer. Pads 1230 and posts 1240 are formed as discussed above with reference to FIGS. 8A–8I, so that the top bump flanges 1231 are initially in contact with the surface of the apertured layer. The apertured layer 1210 is etched or dissolved from the first surface of a sacrificial layer (not shown). However, the etching or dissolving process is arrested before the entire apertured layer 1210 has been removed, and a portion of layer 1210 remains on the first surface of the sacrificial layer. For example, if the apertured layer 1210 is comprised of a polymide, a hot caustic solution can be used to remove a portion of the patternable layer 1210. An etch rate may be selected for the hot caustic solution such that only a portion of the patternable layer is removed.

The remaining portion of the aperture layer defines a top surface 1211 recessed below the top bump flanges 1231. The resistive material is applied over this surface 1211. After at least a portion of the sacrificial layer has been removed, the bottom bump flanges 1230 are exposed and extend below the remaining patternable layer 1210. In a variant of this procedure, some or all of the sacrificial layer may be removed from the remaining apertured layer 1210 before the resistive material is applied; the apertured layer will hold the conductive pads in place during application of the resistive material.

The remaining apertured layer 1210 provides an insulating layer at lower surface 1222 of the resistive material 1220. This layer 1210 effectively insulates the resistive material 1220 from whatever device the finished resistive device is mounted on. Further, depending upon the material chosen for the apertured layer 1210, the remaining apertured layer 1210 may provide mechanical support for the resistive device and may block moisture from the resistive material 1220.

Figure 13:
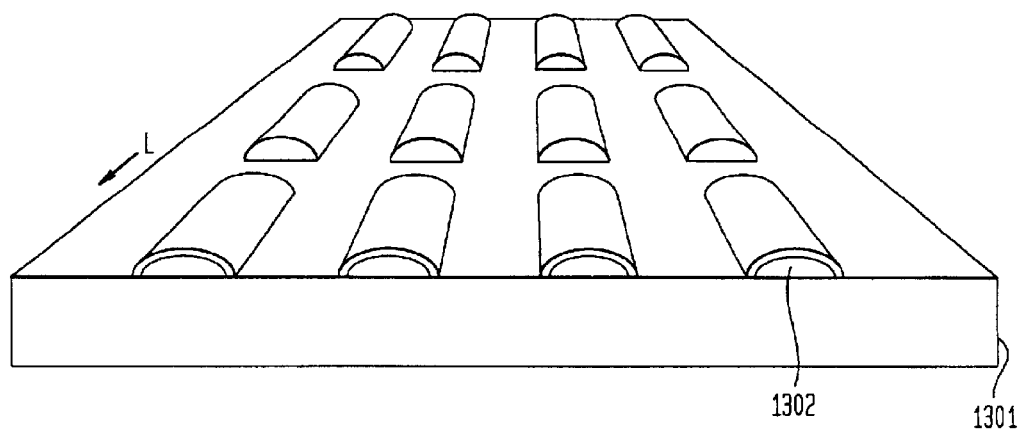
FIG. 13 is a perspective view of a resistor according to yet another embodiment of the invention, manufactured by a method as shown in FIGS. 9A–9H.

As illustrated in FIG. 13, the conductive pads 1302 may be elongated in a direction of elongation L along the surface of the resistive unit. The particular pads shown in FIG. 13 are manufactured by the process as discussed above with reference to FIGS. 9A–9H, but similar elongated pads can be provided by any of the processes described above. The elongated pads can provide for greater mechanical stability. Elongated pads can have greater mechanical strength than round pads having a diameter equal to the narrow dimension of the elongated pads. Moreover, elongated conductive pads act to spread current in the direction of elongation, and thus tend to suppress the effect of local variations in electrical resistivity within the resistive layer 1301.

Figure 14:
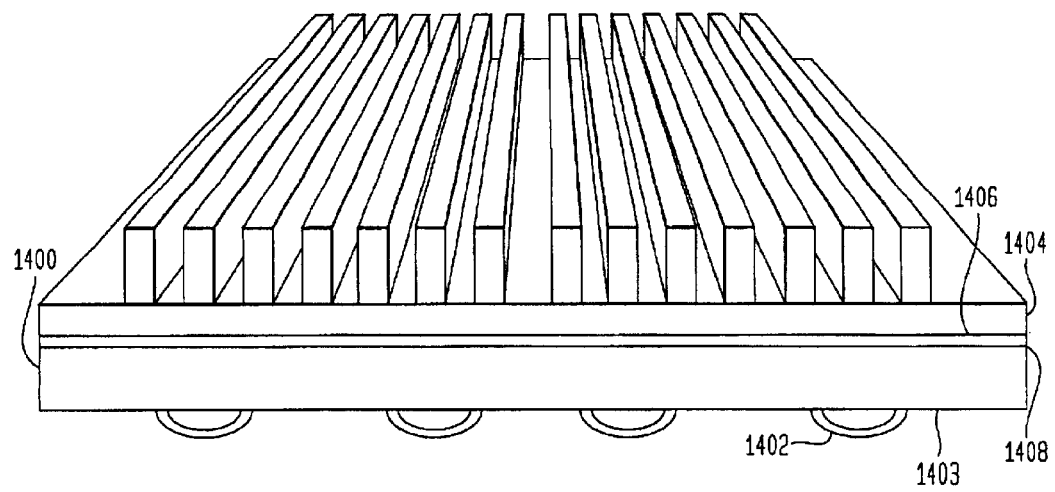
FIG. 14 is a perspective side view of a resistor in conjunction with a heat sink.

As shown in FIG. 14, a resistive device 1400 according to a further embodiment of the invention includes pads 1402, resistive layer 1403 and a heat sink 1404 overlying the top surface of the resistive layer, remote from the pads 1402. The heat sink 1404 is formed from a thermally-conductive material such as, for example, aluminum. Where the material of the heat sink is electrically conductive, a thin dielectric layer 1408 is provided between the base surface 1406 of the heat sink 1404 and the resistive layer 1403. For example, the base surface 1406 of the heat sink may be treated with an insulating finish such as epoxy or anodized. Alternatively, a dielectric layer may be provided on the resistive layer as, for example, by a molding process as discussed above with reference to FIGS. 11A–11E, or by laminating the dielectric layer to the resistive layer. In a further variant, the heat sink and dielectric may be provided as a unit which is applied in place of a simple dielectric layer in a molding process as described with reference to FIGS. 11A–11E. The heat sink 1404 allows the resistive device 1400 to dissipate more power without overheating. While the resistive device 1400 as shown in FIG. 14 is manufactured by the method as shown in FIGS. 9A–9H, resistive devices manufactured by any other method of manufacturing resistors described herein may be mounted onto a heat sink in similar fashion.

Figure 15:
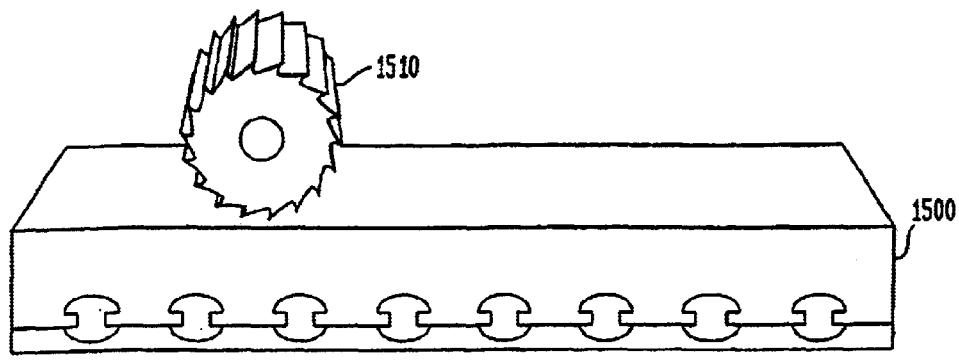
FIG. 15 is a diagrammatic view depicting a bulk sheet trimming process according to a further embodiment of the invention.

As shown in FIG. 15, resistive material can be removed from the resistive unit manufactured in accordance with the processes discussed above using a bulk trimming process. As used in this disclosure, the term "bulk trimming process" refers to a process which reduces the thickness of an entire layer of resistive material, or which brings a layer of non-uniform thickness to a uniform thickness, as by removing high spots in the layer. Mechanical bulk timing processes include milling using a milling cutter 1510; grinding and lapping. Chemical processes such as etching the exposed surface of the resistive layer also may be employed. The method or device used to trim away bulk resistive material depends upon the demands of the resistor device being manufactured. By controlling the thickness of the resistive material 1500, resistor values can be modified to a desired value. One advantage of the methods of manufacturing resistors using a single sacrificial layer discussed previously is that a bulk trimming process can be used before removal of the sacrificial layer. The sacrificial layer reinforces the resistive layer during the bulk trimming process.

Figure 16:
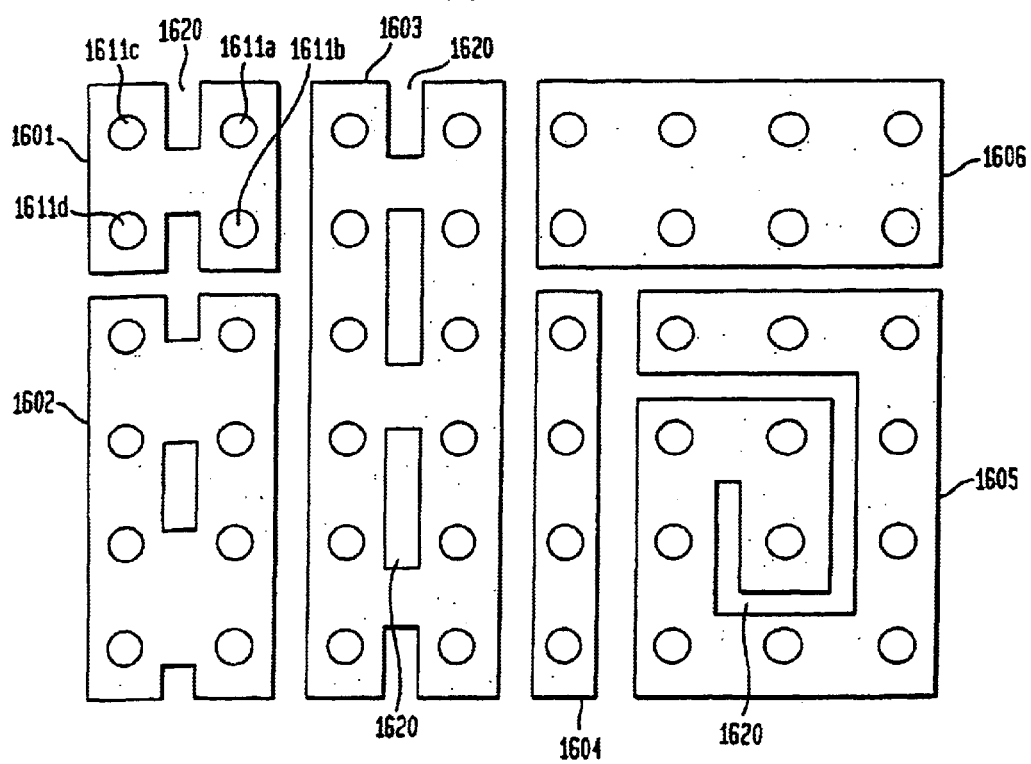
FIG. 16 is a bottom plan view of a resistor array according to one embodiment of the invention.
Figure 17:
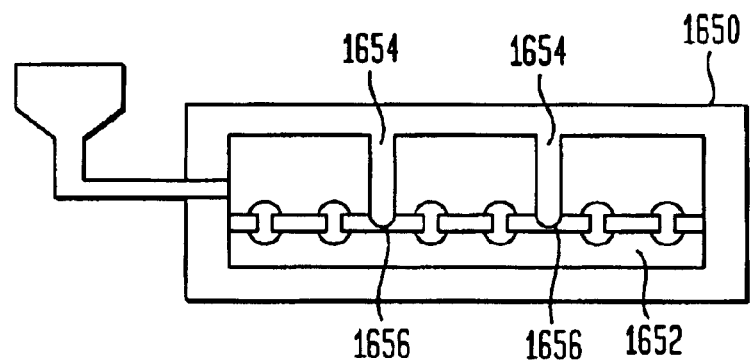
FIG. 17 is a diagrammatic sectional view depicting a mold during a process according to a further embodiment of the invention.

As shown in FIG. 16, a unit including a layer of resistive material with conductive pads can be cut into patterns forming resistor networks connected between the pads. Essentially any desired shape can be formed, the resistor networks 1601–1606 shown in FIG. 16 are merely exemplary. The resistance between any two pads of such a network is determined in part by the resistivity of the resistive layer, and in part by the size and shape of layer portions connecting the two pads. The resistivity of the layer is controlled by the thickness and composition of the layer, as discussed above. The size and shape of the layer portions between any two pads can be set when the network is cut out of the resistive layer. Merely by way of example, network 1601 provides a relatively low resistance between pad 1611a and pad 1611b, and a higher resistance between pad 1611a and pad 1611d. Resistance is proportional to the length of the resistor device between any two pads and inversely proportional to the cross-sectional area of the resistor device in the region between the two pads. Methods such as mechanical cutting of individual units, die cutting, stamping or laser cutting can be used to separate the individual resistor networks from the layer and to fix the horizontal dimensions of the various parts of the individual resistor networks. The horizontal dimensions are the dimensions in the directions parallel to the surfaces of the layer. Discrete value setting or customization of resistors can be achieved. The individual resistor networks can be further trimmed by selectively removing portions of the network. Such individual trimming processes can be controlled by monitoring the resistance value between pads. Each assembly can be overmolded after resistor trimming. In a further alternative, the individual resistor networks can be formed as individual units by applying the resistive material in discrete masses, rather than in continuous layers. For example, in an injection or compression molding process, a mold 1650 (FIG. 17) can be provided with ribs 1654 projecting into the interior of the mold cavity, towards the sacrificial layer 1652. Each rib defines a narrow gap 1656 adjacent the sacrificial layer. When the resistive material is introduced into the mold, the resulting resistive layer will have grooves at the locations occupied by the ribs 1654. The unit can be broken apart at the grooves after removing the sacrificial layer. In other embodiments, the ribs can completely isolate the various portions of the resistive layer from one another during the molding process. For example, the ribs may be arranged to abut the sacrificial layer when the mold is fully closed; the resistive material may be injected or placed in the mold before the mold is fully closed. The gaps or open spaces 1620 within individual resistor networks also may be formed by such a molding process.

Figure 18:
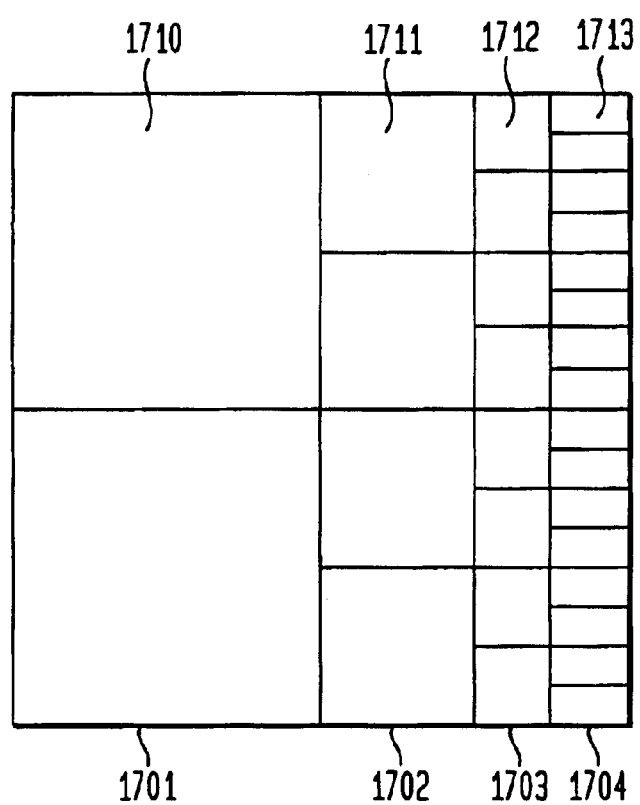
FIG. 18 is a top plan view of a resistor array according to a further embodiment of the invention during one stage of a manufacturing process.

By taking a resistor unit or array and slicing it into a series of elongated strips 1701–1704 (FIG. 18), and subsequently dividing each elongated strip 1701–1704 into still smaller pieces 1710, 1711, 1712, 1713, for example, a number of resistors of identical or varied resistance can be created. Each such resistor desirably includes at least one conductive pad at each end of the resistor. In yet another alternative, each resistor may include only one conductive pad of any of the types described above, the conductive pad being disposed on a bottom surface of the resistive layer. A second connection may be provided by a conductive element of any type disposed on the top surface of the resistive layer, or on an edge of the resistor.

The individual resistors can be trimmed to the desired resistance values, using the methods discussed above, to selectively remove resistor material and provide a resistor of a preselected value to a high degree of accuracy.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of making at least one resistor, the method comprising:

providing a sacrificial layer having a first surface and one or more pads including at least one electrically conductive material disposed over at least one region of said first surface;

depositing an electrically resistive material including electrically conductive particles in a binder over said pads and over said first surface of said sacrificial layer to thereby form at least one unit including said electrically resistive material and said one or more pads; and removing at least a portion of said sacrificial layer to expose said one or more pads.

2. The method as claimed in claim 1, wherein a plurality of resistors is manufactured simultaneously using a single sacrificial layer, the method further comprising separating at least some of said resistors from one another after at least a portion of the sacrificial layer has been removed.

3. The method as claimed in claim 2, wherein said step of separating at least some of said resistors includes subdividing at least one of said units.

4. The method as claimed in claim 1, wherein said step of providing said sacrificial layer and said pads includes depositing said at least one conductive material onto said first surface of said sacrificial layer.

5. The method as claimed in claim 4, wherein said step of providing said sacrificial layer and said pads includes providing cavities in said first surface of said sacrificial layer and said step of depositing said conductive material includes depositing said at least one conductive material into said cavities.

6. The method as claimed in claim 1, wherein said step of removing at least a portion of the sacrificial layer includes etching the sacrificial layer.

7. The method as claimed in claim 1, wherein each said pad is elongated.

8. The method as claimed in claim 1 wherein said sacrificial layer includes a dielectric defining said first surface, the method further comprising the step of disposing a seed layer on said first surface of said sacrificial layer, said step of depositing at least one conductive material including the step of plating conductive material onto said seed layer.

9. The method as claimed in claim 8, further comprising the step of at least partially removing said seed layer from each said unit during or after the step of removing said sacrificial layer.

10. The method as claimed in claim 1, further comprising removing excess electrically resistive material from each said unit using a bulk trimming process.

11. The method as claimed in claim 1, further comprising providing a heat sink having a first surface wherein said electrically resistive material forms an electrically resistive layer having a first surface and a second surface, wherein said first surface of said electrically resistive layer is connected to said first surface of said heat sink.

12. The method as claimed in claim 1, further comprising before depositing said electrically resistive material, providing an insulating layer having a first surface and a second surface, wherein said electrically resistive material is deposited between said second surface of said insulating layer and said first surface of said sacrificial layer.

13. The method as claimed in claim 12, wherein a plurality of resistors are manufactured simultaneously using a single sacrificial layer and a common insulating layer, the method further comprising separating at least some of said resistors from one another after removing at least a portion of the sacrificial layer, wherein said separated resistors remain connected to said common insulating layer.

14. The method as claimed in claim 1, further comprising trimming said electrically resistive material in at least one said unit to control electrical resistance of at least one said unit.

15. The method as claimed in claim 1, wherein said step of removing at least a portion of said sacrificial layer includes separating said sacrificial layer from said at least one unit while leaving said sacrificial layer intact.

16. The method as claimed in claim 15, wherein said sacrificial layer is comprised of stainless steel.

17. A method of making at least one resistor, the method comprising:

providing a sacrificial layer having a first surface and one or more pads including at least one electrically conductive material disposed over at least one region of said first surface;

depositing an electrically resistive material over said pads and over said first surface of said sacrificial layer to thereby form at least one unit including said electrically resistive material and said one or more pads; and removing at least a portion of said sacrificial layer to expose said one or more pads;

wherein said step of providing said sacrificial layer and said pads includes depositing said at least one conductive material onto said first surface of said sacrificial layer;

wherein said step of providing said sacrificial layer and said pads includes providing cavities in said first surface of said sacrificial layer and said step of depositing said conductive material includes depositing said at least one conductive material into said cavities; and wherein said step of providing said cavities in said first surface includes providing an apertured layer on said first surface and etching said first surface through apertures in said apertured layer.

18. The method as claimed in claim 17, wherein said apertured layer is comprised of an etch resistant material.

19. The method as claimed in claim 18 wherein said step of providing an apertured layer includes:

disposing a patternable layer on said first surface of said sacrificial layer; and patterning said patternable layer to form apertures therein.

20. The method as claimed in claim 19, wherein said patternable layer is comprised of a photoresist.

21. The method as claimed in claim 17, further comprising removing at least a portion of said apertured layer from said first surface of said sacrificial layer.

22. The method as claimed in claim 21, wherein all of said apertured layer is removed from said first surface of said sacrificial layer.

23. The method as claimed in claim 21, wherein only a portion of said patternable layer is removed from said first surface of said sacrificial layer.

24. A method of making at least one resistor, the method comprising:

providing a sacrificial layer having a first surface and one or more pads including at least one electrically conductive material disposed over at least one region of said first surface;

depositing an electrically resistive material over said pads and over said first surface of said sacrificial layer to thereby form at least one unit including said electrically resistive material and said one or more pads; and removing at least a portion of said sacrificial layer to expose said one or more pads;

wherein said step of providing said sacrificial layer and said pads includes depositing said at least one conductive material onto said first surface of said sacrificial layer;

wherein said step of providing said sacrificial layer and said pads includes providing cavities in said first surface of said sacrificial layer and said step of depositing said conductive material includes depositing said at least one conductive material into said cavities; and wherein said step of depositing said at least one conductive material into said cavities includes depositing a first conductive material into said cavities and then depositing a second conductive material in said cavities of said sacrificial layer.

25. A method of making at least one resistor, the method comprising:

providing a sacrificial layer having a first surface and one or more pads including at least one electrically conductive material disposed over at least one region of said first surface;

depositing an electrically resistive material over said pads and over said first surface of said sacrificial layer to thereby form at least one unit including said electrically resistive material and said one or more pads; and removing at least a portion of said sacrificial layer to expose said one or more pads;

wherein each said pad includes a post and at least one flange wider than the post portion.

26. The method as claimed in claim 25, wherein each said pad has a rivet-like shape including a pair of flanges at opposite ends of the post.

27. The method as claimed in claim 25, wherein said step of depositing said electrically resistive material is performed so as to embed one flange and at least a part of the post of each said pad in the electrically resistive material while leaving at least part of the other flange of each said pad exposed at a surface of said electrically resistive material.

28. The method as claimed in claim 25, further comprising providing an apertured layer on said first surface of said sacrificial layer before depositing said at least one conductive material, said step of depositing said at least one conductive material including depositing conductive material in the apertures of said apertured layer to form the posts of said pads and depositing conductive material on a surface of said apertured layer remote from said sacrificial layer to form top flanges of said pads, the method further comprising removing at least a portion of said apertured layer from said first surface of said sacrificial layer prior to depositing said resistive material so as to leave the posts and top flanges of said pads projecting from said sacrificial layer.

29. A method of making at least one resistor, the method comprising:

providing a sacrificial layer having a first surface and a plurality of cavities in the first surface of said sacrificial layer;

depositing one or more conductive materials within said cavities to form conductive pads within said cavities;

disposing an electrically resistive material including electrically conductive particles in a binder over the first surface of the sacrificial layer and the pads to thereby form one or more units; and removing at least a portion of said sacrificial layer to expose said pads.

30. The method as claimed in claim 29, wherein a plurality of resistors are manufactured simultaneously using the same sacrificial layer, the method further comprising a step of separating at least some of the resistors from one another after at least a portion of the sacrificial layer has been removed.

31. The method as claimed in claim 29, further comprising subdividing one said unit to provide a plurality of individual resistors.

32. The method as claimed in claim 29, further comprising, before depositing said electrically resistive material, providing an insulating layer having a first surface and a second surface, wherein said resistive material is deposited between said second surface of said insulating layer and said first surface of said sacrificial layer.

33. A method of making at least one resistor, the method comprising:

providing a sacrificial layer having a first surface and a plurality of cavities in the first surface of said sacrificial layer;

depositing one or more conductive materials within said cavities to form conductive pads within said cavities;

disposing an electrically resistive material over the first surface of the sacrificial layer and the pads to thereby form one or more units; and removing at least a portion of said sacrificial layer to expose said pads;

wherein said step of depositing one or more conductive materials is performed so as to form said pads as hollow shells within said cavities, and wherein said step of disposing electrically resistive material includes applying said electrically resistive material into said hollow shells.

34. A method of making at least one resistor, the method comprising:

providing a sacrificial layer having a first surface and a plurality of cavities in the first surface of said sacrificial layer;

depositing one or more conductive materials within said cavities to form conductive pads within said cavities;

disposing an electrically resistive material over the first surface of the sacrificial layer and the pads to thereby form one or more units; and removing at least a portion of said sacrificial layer to expose said pads; and disposing an apertured layer on said first surface of said sacrificial layer, said step of providing said sacrificial layer including etching said sacrificial layer through said apertures to form said cavities.

35. The method as claimed in claim 34, wherein said step of providing said apertured layer includes disposing a patternable layer on the first surface of said sacrificial layer and patterning said patternable layer to form said apertures.

36. The method as claimed in claim 34, further comprising removing at least a portion of said apertured layer from said first surface of the sacrificial layer before depositing said electrically resistive material.

37. The method as claimed in claim 36, wherein all of said patternable layer is removed from the first surface of the sacrificial layer before depositing said electrically resistive material.

* * * * *

UNITED STATES PATENT AND TRADEMARK OFFICE
CERTIFICATE OF CORRECTION

PATENT NO. : 6,821,821 B2
DATED : November 23, 2004
INVENTOR(S) : Joseph Fjelstad It is certified that error appears in the above-identified patent and that said Letters Patent is hereby corrected as shown below:

<u>Column 3,</u>
Lines 35-37, "chip package having a second semiconductor chip back-bonded to the first chip such separate" should read -- chip package having a separate --.

Signed and Sealed this

Tenth Day of May, 2005

JON W. DUDAS
*Director of the United States Patent and Trademark Office*